US012665574B2

(12) United States Patent
Chen et al.

(10) Patent No.: US 12,665,574 B2
(45) Date of Patent: Jun. 23, 2026

(54) SWITCHABLE ACOUSTIC FILTER TOPOLOGIES WITH IMPROVED PERFORMANCE

(71) Applicant: SKYWORKS SOLUTIONS, INC., Irvine, CA (US)

(72) Inventors: Kun Chen, Thousand Oaks, CA (US); Hao Wang, San Jose, CA (US); Li Chen, Irvine, CA (US); Ahmad Adel Ahmad Gheethan, Newbury Park, CA (US); Zhi Shen, Aliso Viejo, CA (US)

(73) Assignee: SKYWORKS SOLUTIONS, INC., Irvine, CA (US)

( * ) Notice: Subject to any disclaimer, the term of this patent is extended or adjusted under 35 U.S.C. 154(b) by 90 days.

(21) Appl. No.: 18/613,675

(22) Filed: Mar. 22, 2024

(65) Prior Publication Data

US 2024/0348235 A1      Oct. 17, 2024

Related U.S. Application Data

(60) Provisional application No. 63/495,540, filed on Apr. 11, 2023.

(51) Int. Cl.
H03H 9/70          (2006.01)

(52) U.S. Cl.
CPC .................................... H03H 9/70 (2013.01)

(58) Field of Classification Search
CPC .... H03H 9/6483; H03H 9/542; H03H 9/6403; H03H 9/605; H03H 9/725; H03H 9/706; H03H 9/568; H03H 9/72; H03H 9/64; H03H 9/14541; H03H 9/205; H03H 9/25; H03H 9/6406; H03H 9/70; H03H 9/6489; H03H 7/0115; H03H 7/0161; H03H 9/0542; H03H 2210/025; H03H 9/02007; H03H 2210/026; H03H 7/38; H03H 7/075; H03H 9/145; H03H 2210/036; H03H 9/54; H03H 9/6436; H03H 9/703; H03H 2210/012; H03H 9/14544; H03H 7/09; H03H 7/18; H03H 9/0557; H03H 9/545; H03H 9/58; H03H 9/6433; H03H 2009/02173; H03H 7/465; H03H 9/68; H03H 7/01; H03H 7/1775; H03H 9/02086; H03H 9/02834; H03H 9/46; H03H 11/04; H03H 2210/015; H03H 7/1758; H03H 7/1766; H03H 7/46;
(Continued)

(56) References Cited

U.S. PATENT DOCUMENTS

| | | | | | |
|---|---|---|---|---|---|
| 5,291,159 | A | * | 3/1994 | Vale | ........................ H03H 7/175 |
| | | | | | 333/188 |
| 10,187,109 | B2 | * | 1/2019 | Saji | ........................ H04B 1/006 |

(Continued)

OTHER PUBLICATIONS

Bl et al., "Bulk Acoustic Wave RF Technology," IEEE Microwave Magazine, Oct. 2008, pp. 65-80.

*Primary Examiner* — John W Poos
(74) *Attorney, Agent, or Firm* — Lando & Anastasi, LLP

(57)          ABSTRACT

An adjustable filter having a first contact; a second contact; and one or more switchable resonator circuits coupled between the first contact and the second contact, each switchable resonator circuit including a switch, a first impedance, and a resonator coupled in parallel with a second impedance, a parallel combination of the resonator and second impedance being coupled in series with the first impedance.

18 Claims, 16 Drawing Sheets

(58) Field of Classification Search
CPC ............. H03H 9/02637; H03H 9/6409; H03H 9/0004; H03H 9/0014; H03H 9/0095; H03H 9/02228; H03H 9/1455; H03H 9/52; H03H 9/547; H03H 7/0153; H03H 7/463; H03H 9/0028; H03H 9/02157; H03H 9/14538; H03H 9/6426; H03H 2007/013; H03H 2009/02165; H03H 7/1725; H03H 7/175; H03H 7/19; H03H 7/461; H03H 9/02149; H03H 9/02929; H03H 9/14514; H03H 11/28; H03H 11/34; H03H 2009/02204; H03H 2250/00; H03H 7/0123; H03H 9/02275; H03H 9/02433; H03H 9/0571; H03H 9/60; H03H 9/66; H03H 2003/0071; H03H 2003/027; H03H 2003/0464; H03H 2003/0471; H03H 2003/0478; H03H 2007/386; H03H 2009/02196; H03H 2009/02496; H03H 2210/021; H03H 2210/023; H03H 2210/033; H03H 3/0073; H03H 3/0076; H03H 3/04; H03H 7/12; H03H 9/02102; H03H 9/02866; H03H 9/0566; H03H 9/0576; H03H 9/13; H03H 9/132; H03H 9/17; H03H 9/171; H03H 9/564; H03H 9/6466; H03H 9/6476; H03H 9/6479; H03H 9/6493; H03H 9/6496; H03H 9/0552; H03H 9/14502; H03H 9/584; H03H 9/6413; H03H 11/1208; H03H 11/1291; H03H 11/38; H03H 19/004; H03H 3/02; H03H 7/17; H03H 7/1741; H03H 7/1783; H03H 7/52; H03H 9/02015; H03H 9/02031; H03H 9/0547; H03H 9/131; H03H 9/1457; H03H 9/175; H03H 9/48; H03H 9/582; H03H 9/585; H03H 9/587; H03H 9/588; H03H 9/589; H03H 7/40; H03H 2003/023; H03H 11/02; H03H 2001/0057; H03H 9/1014; H03H 9/581; H03H 2003/021; H03H 9/0523; H03H 2/005; H03H 2011/0488; H03H 7/42; H03H 9/02818; H03H 9/14582; H03H 9/50; H03H 9/6423; H03H 1/00; H03H 11/48; H03H 11/481; H03H 19/006; H03H 19/008; H03H 9/562; H03H 9/76; H03H 2003/0414; H03H 3/00; H03H 9/0009; H03H 9/02118; H03H 11/1221; H03H 17/0286; H03H 17/0289; H03H 17/0291; H03H 2001/0021; H03H 2001/0035; H03H 2001/0085; H03H 2260/00; H03H 3/08; H03H 7/383; H03H 9/0042; H03H 9/0057; H03H 9/02133; H03H 9/02543; H03H 9/02559; H03H 9/0514; H03H 9/1007; H03H 9/173; H03H 9/19
See application file for complete search history.

(56) References Cited

U.S. PATENT DOCUMENTS

2017/0155375 A1* 6/2017 Schmidhammer ..... H03H 9/545
2017/0331454 A1* 11/2017 Cihangir ................ H03H 9/605

* cited by examiner

SWITCHABLE ACOUSTIC FILTER TOPOLOGIES WITH IMPROVED PERFORMANCE

CROSS-REFERENCE TO RELATED APPLICATIONS

This application claims priority under 35 U.S.C. § 119(e) to U.S. Provisional Patent Application Ser. No. 63/495,540, titled "SWITCHABLE ACOUSTIC FILTER TOPOLO-GIES WITH IMPROVED PERFORMANCE," filed Apr. 11, 2023, the subject matter which being incorporated herein by reference for all purposes.

BACKGROUND

Switchable multiplexers have seen emerging uses in 5G cellular applications. Switchable multiplexers can provide versatility over non-switchable multiplexers. However, switches have insertion loss of approximately 0.3 dB per switch.

SUMMARY

According to at least one aspect of the present disclosure, an adjustable filter is presented, comprising: a first contact; a second contact; and one or more switchable resonator circuits coupled between the first contact and the second contact, each switchable resonator circuit including a switch, a first impedance, and a resonator coupled in parallel with a second impedance, a parallel combination of the resonator and second impedance being coupled in series with the first impedance.

In some examples, the adjustable filter further comprises a resonator circuit coupled in parallel with the one or more switchable resonator circuits between the first contact and second contact, the resonator circuit comprising: a second parallel combination of a resonator and an impedance; and a series impedance coupled in series with the second parallel combination. In some examples, the switch is coupled in parallel with the first impedance and the parallel combina-tion of the resonator and second impedance. In some examples, the switch is coupled in series with the first impedance. In some examples, the one or more switchable resonator circuits are coupled in series with one another between the first contact and the second contact. In some examples, the adjustable filter further comprises a series resonator coupled in series with a first switchable resonator circuit of the one or more switchable resonator circuits. In some examples, the one or more switchable resonator cir-cuits are coupled in parallel with one another between the first contact and the second contact. In some examples, resonator circuits of the one or more resonator circuits further include a parallel resonator coupled in parallel with the parallel combination. In some examples, the adjustable filter further comprises a parallel impedance coupled in parallel with the switch. In some examples, the adjustable filter further comprises a second switch coupled in series with the second impedance, a series combination of the second switch and second impedance being coupled in parallel with the first impedance. In some examples, the adjustable filter further comprises a plurality of resonators including a first group of series resonators and second group of parallel resonators, the first group of series resonators being coupled between an output of a switchable resonator circuit of the one or more switchable resonator circuits and the second contact. In some examples, each second group resonator of the second group of parallel resonators being coupled to a reference node and to a respective first group resonator of the first group of series resonators.

According to at least one aspect of the present disclosure, an adjustable filter is provided, comprising: a contact; a first contact; a second contact; a third contact; a first branch coupled between the contact and the first contact; a second branch coupled between the contact and the second contact; a third branch coupled between the contact and the third contact; and one or more switchable resonators coupled to one or more of the first branch, the second branch, and the third branch.

In some examples, the first branch further comprises: a first plurality of impedances coupled in series with respect to one another; and a second plurality of impedance coupled to the first plurality of impedance, the third contact, and a reference node. In some examples, the first branch com-prises a plurality of resonators coupled in series between the contact and the first contact, and one or more switchable resonators coupled between one or more resonators of the plurality of resonators and a reference node. In some examples, the second branch comprises a first plurality of resonators coupled in series between the contact and the second contact, and a second plurality of resonators, each resonator of the second plurality of resonators being coupled between a resonator of the first plurality of resonators and a reference node, wherein at least one resonator of the first plurality of resonators is a switchable resonator. In some examples, each switch of the one or more switches is located on a same substrate. In some examples, the first branch further comprises a first pair of resonators; a first impedance coupled to the first pair of resonators; a parallel combination of at least one impedance and at least one resonator, the parallel combination coupled in series with the first pair of resonators with respect to the first contact and the contact; at least one second impedance coupled to the first contact; at least one third impedance coupled between the at least one second impedance and a reference node; at least two reso-nators coupled in series with one another with respect to the contact and the reference node, and further coupled to the parallel combination and the first impedance; and a switch coupled in parallel with one or more resonators of the at least two resonators and configured to selectively bypass the one or more resonators; and the second branch further comprises a first plurality of resonators coupled in series with respect to the contact and the second contact; at least one impedance coupled to the first plurality of resonators; a second plurality of resonators coupled in parallel with the first plurality of resonators with respect to the contact and first contact; a module coupled in series with the first plurality of resonators and the second contact; and a switch coupled between the first plurality of resonators and the contact.

According to at least one aspect of the present disclosure, an adjustable filter is presented, comprising: an input; an output; a switch coupled to the input; a resonator coupled to the output; an impedance coupled in parallel with the resonator or the switch, the switch being configured to selectively, electromagnetically couple and decouple the impedance from the input and the output.

According to at least one aspect of the present disclosure and adjustable filter is provided. The adjustable filter com-prises a first node; a second node; at least one resonator coupled between the first node and the second node; at least one impedance coupled to the at least one resonator and coupled between the first node and the second node; and at least one switch coupled to the at least one impedance, the switch being configured to selectively establish a conducting path from the first node, through the at least one impedance, and to the second node.

In some examples, the first node is a first contact and the second node is a second contact. In some examples, the first node is a first contact and the second node is a reference node. In some examples, the at least one impedance is one or more inductors or capacitors. In some examples, the at least one impedance is one or more impedances coupled in series with respect to one another. In some examples, the at least one impedance is one or more impedances coupled in parallel with respect to one another.

According to at least one aspect of the present disclosure, an adjustable filter is provided. The adjustable filter comprises a first contact; a second contact; and one or more switchable resonator circuits coupled in parallel with one another between the first contact and second contact, each switchable resonator circuit including: a switch; a first impedance coupled in series with the switch; a resonator coupled with a second impedance, the resonator and second impedance being collectively coupled in parallel, and a parallel combination of the resonator and second impedance being coupled in series with the switch and first impedance.

In some examples, the adjustable filter further comprises a resonator circuit coupled in parallel with the one or more switchable resonator circuits between the first contact and second contact, the resonator circuit comprising: a parallel combination of a resonator and an impedance; and a series impedance coupled in series with the parallel combination.

According to at least one aspect of the present disclosure, an adjustable filter is provided. The adjustable filter comprises a first contact; a second contact; and one or more switchable resonators coupled in series with one another between the first contact and second contact, each switchable resonator circuit including: a first impedance coupled in series to a parallel combination of a second impedance and a resonator; and a switch coupled in parallel to the first impedance and configured to selectively create a bypass path bypassing the first impedance.

In some examples, the switch is coupled in parallel to a combination of the first impedance and the parallel combination of the second impedance and the resonator, wherein the switch is configured to selectively create a bypass bath bypassing the first impedance and the parallel combination of the second impedance and the resonator. In some examples, the adjustable filter further comprises a resonator coupled to the first contact and to one of the one or more switchable resonators.

According to at least one aspect of the present disclosure, a switchable resonator is provided. The switchable resonator comprises a first contact; a second contact; a first plurality of impedance coupled in parallel with one another and a switch; a first impedance coupled to the switch and to a parallel combination of a first resonator and a second impedance; a second resonator coupled in parallel with the switch and at least one of the first impedance, second impedance, and first resonator; and the switch being configured to selectively couple the first plurality of impedances to a conducting path from the first contact to the second contact and through the first impedance.

According to at least one aspect of the present disclosure, a switchable resonator is provided. The switchable resonator comprises a first contact; a second contact; a parallel combination of an impedance and a switch, the switch being configured to selectively couple the impedance to a conducting path from the first contact to the second contact; a series combination of an impedance a switch, the switch being configured to selectively couple the impedance to a conducting path from the first contact to the second contact; and a resonator coupled between the first contact and the second contact.

According to at least one aspect of the present disclosure, a circuit for conditioning a signal is provided. The circuit resonator comprises a first contact; a second contact; one or more switchable resonators coupled in series with one another between the first contact and the second contact; one or more resonators coupled between the one or more switchable resonators and the second contact.

In some examples, at least one of the one or more switchable resonators are coupled between a conducting path from the first contact to the second contact and a reference node. In some examples, the circuit further comprises a capacitor coupled to a reference node and to one of the one or more switchable resonators. In some examples, each switchable resonator comprises: a first resonator coupled between an input and an output of the switchable resonator; a switch coupled to the input and to a first impedance; a parallel combination of a second resonator and a second impedance coupled between the first impedance and the output; and the switch being configured to selectively form a conducting path between the first contact and the second contact through at least the first impedance.

According to at least one aspect of the present disclosure, a circuit is provided comprising a first contact; a second contact; one or more switchable resonators coupled in a series configuration between the first contact and the second contact; one or more switchable resonators coupled in a shunt configuration between the first contact and the second contact and one or more of the one or more switchable resonators coupled in the series configuration; one or more resonators coupled in a series configuration between the first contact and the second contact; and one or more resonators coupled in a shunt configuration between the first contact and the second contact and one or more of the one or more resonators coupled in the series configuration.

According to at least one aspect of the present disclosure, a triplexer is provided comprising a contact; a first contact; a second contact; a third contact; a first branch coupled between the contact and the first contact; a second branch coupled between the contact and the second contact; a third branch coupled between the contact and the third contact; and one or more switchable resonators coupled to one or more of the first branch, the second branch, and the third branch.

In some examples, the first branch further comprises: a first plurality of impedances coupled in series with respect to one another; and a second plurality of impedance coupled to the first plurality of impedance, the third contact, and a reference node. In some examples, the first branch comprises a plurality of resonators coupled in series between the contact and the first contact, and one or more switchable resonators coupled between one or more resonators of the plurality of resonators and a reference node. In some examples, the triplexer further comprises a filter coupled between the first contact and a resonator of the plurality of resonators. In some examples, the second branch comprises a first plurality of resonators coupled in series between the contact and the second contact, and a second plurality of resonators, each resonator of the second plurality of resonators being coupled between a resonator of the first plurality of resonators and a reference node, wherein at least one resonator of the first plurality of resonators is a switchable resonator.

In some examples, the triplexer further comprises a filter coupled between the second contact and a resonator of the first plurality of resonators. In some examples, the triplexer further a capacitor coupled between the second branch and a reference node. In some examples, the triplexer further comprises one or more switches. In some examples, each switch of the one or more switches is located on a same substrate. In some examples, the first branch further comprises: a first pair of resonators; a first impedance coupled to the first pair of resonators; a parallel combination of at least one impedance and at least one resonator, the parallel combination coupled in series with the first pair of resonators with respect to the first contact and the contact; at least one second impedance coupled to the first contact; at least one third impedance coupled between the at least one second impedance and a reference node; at least two resonators coupled in series with one another with respect to the contact and the reference node, and further coupled to the parallel combination and the first impedance; and a switch coupled in parallel with one or more resonators of the at least two resonators and configured to selectively bypass the one or more resonators. In some examples, any of the resonators are switchable resonators.

In some examples, the second branch further comprises: a first plurality of resonators coupled in series with respect to the contact and the second contact; at least one impedance coupled to the first plurality of resonators; a second plurality of resonators coupled in parallel with the first plurality of resonators with respect to the contact and first contact; a module coupled in series with the first plurality of resonators and the second contact; and a switch coupled between the first plurality of resonators and the contact. In some examples the switch is configured to selectively couple the first plurality of resonators to a conducting path between the contact and the second contact.

BRIEF DESCRIPTION OF THE DRAWINGS

Various aspects of at least one embodiment are discussed below with reference to the accompanying figures, which are not intended to be drawn to scale. The figures are included to provide an illustration and a further understanding of the various aspects and embodiments, and are incorporated in and constitute a part of this specification, but are not intended as a definition of the limits of any particular embodiment. The drawings, together with the remainder of the specification, serve to explain principles and operations of the described and claimed aspects and embodiments. In the figures, each identical or nearly identical component that is illustrated in various figures is represented by a like numeral. For purposes of clarity, not every component may be labeled in every figure. In the figures:

DETAILED DESCRIPTION

Examples of the methods and systems discussed herein are not limited in application to the details of construction and the arrangement of components set forth in the following description or illustrated in the accompanying drawings. The methods and systems are capable of implementation in other embodiments and of being practiced or of being carried out in various ways. Examples of specific implementations are provided herein for illustrative purposes only and are not intended to be limiting. In particular, acts, components, elements and features discussed in connection with any one or more examples are not intended to be excluded from a similar role in any other examples.

Also, the phraseology and terminology used herein is for the purpose of description and should not be regarded as limiting. Any references to examples, embodiments, components, elements or acts of the systems and methods herein referred to in the singular may also embrace embodiments including a plurality, and any references in plural to any embodiment, component, element or act herein may also embrace embodiments including only a singularity. References in the singular or plural form are not intended to limit the presently disclosed systems or methods, their components, acts, or elements. The use herein of "including," "comprising," "having," "containing," "involving," and variations thereof is meant to encompass the items listed thereafter and equivalents thereof as well as additional items.

References to "or" may be construed as inclusive so that any terms described using "or" may indicate any of a single, more than one, and all of the described terms. In addition, in the event of inconsistent usages of terms between this document and documents incorporated herein by reference, the term usage in the incorporated features is supplementary to that of this document; for irreconcilable differences, the term usage in this document controls.

Conventional switchable multiplexers suffer from substantial insertion losses. The insertion losses may be eliminated or reduced using the topologies, systems, and methods described herein. In particular, resonators of different frequencies are placed in parallel or cascade (series), allowing the switching design of the switchable multiplexer to be simplified and reducing or eliminating insertion losses from the switch.

Figure 1A:
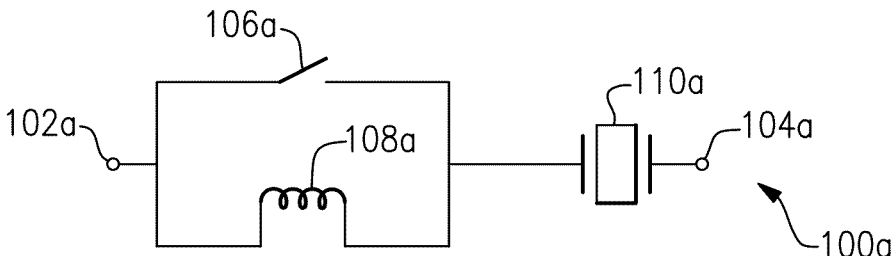
FIG. 1A illustrates a switchable resonator according to an example.
Figure 1B:
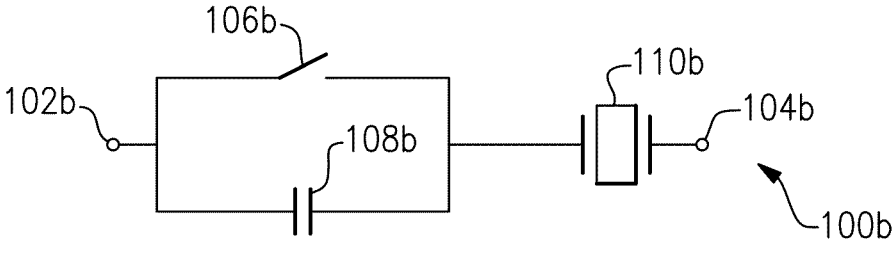
FIG. 1B illustrates a switchable resonator according to an example.
Figure 1C:
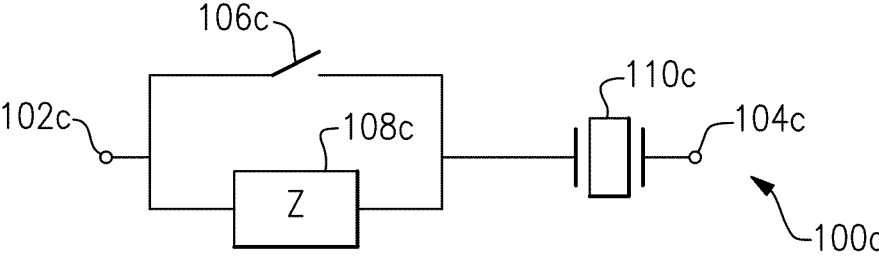
FIG. 1C illustrates a switchable resonator according to an example.

Resonators have a resonant frequency, $F_R$, and an antiresonant frequency, $F_A$. The resonant and antiresonant frequencies may be adjusted using reactive elements (such as capacitors, inductors, or other impedances) depending on the inductance and/or capacitance of the element and the position of the element relative to the resonator. FIGS. 1A-1C illustrate reactive elements in series with the resonator.

FIG. 1A illustrates a switchable resonator circuit 100a according to an example. The switchable resonator circuit 100a includes a first contact 102a, a second contact 104a, a switch 106a, an inductor 108a, and a resonator 110a.

The first contact 102a is coupled to the switch 106a and to the inductor 108a. The switch 106a and the inductor 108a are coupled to the resonator 110a. In some examples, the switch 106a and the inductor 108a are coupled in parallel with one another to the resonator 110a. The resonator 110a is coupled to the second contact 104a.

The switch 106a may be any kind of switching device, for example, a relay, a physical switch, a transistor, and so forth. The switch 106a may be controlled by an external controller, such as a processor, computer, control circuit, or otherwise. The switch 106a may be controlled to be in an open state (that is, non-conducting) or a closed state (that is, conducting). The switch 106a may be switched between the open and closed states.

The inductor 108a has a frequency dependent impedance. The inductor 108a may be used to adjust the one or more edges of a frequency band associated with the resonator 110a. For example, the resonator 110a may allow certain frequencies to pass through—that is, the resonator 110a may act as a filter, for example a high, low, band-pass, or band-reject filter. The inductor 108a may be used to adjust the filtering characteristics of the resonator 110a such that the range of frequencies the resonator 110a passes or rejects is changed due to the characteristics of the inductor 108a.

The inductor 108a is coupled in series with the resonator 110a with respect to the first contact 102a and the second contact 104a when the switch 106a is open (when the switch 106a is closed, the inductor 108a is bypassed (that is, the switch impedance dominates the parallel of the switch 106a and the inductor 108a as the switch 106a is low impedance; also, the parallel of the switch 106a and the inductor 108a will effectively make the loss lower than either the switch 106a or the inductor 108a standing alone)). When the inductor 108a is coupled in series with the resonator 110a, the effective $F_R$ of the switchable resonator circuit 100a may be shifted to a lower frequency.

FIG. 1B illustrates a switchable resonator circuit 100b according to an example. The switchable resonator circuit 100b is similar to the switchable resonator circuit 100a of FIG. 1A except that the inductor 108a has been substituted for a capacitor 108b. The switchable resonator circuit 100b includes a first contact 102b, a second contact 104b, a switch 106b, a capacitor 108b, and a resonator 110b.

The first contact 102b is coupled to the switch 106b and the capacitor 108b. The switch 106b and the capacitor 108b are coupled to the resonator 110b. In some examples, the switch 106b and the capacitor 108b are coupled in parallel with one another to the resonator 110b. The resonator 110b is coupled to the second contact 104b.

When switch 106b is open, the capacitor 108b is coupled in series with the resonator 110a (when the switch 106b is closed, the capacitor 108b is bypassed and the switch impedance dominates the parallel of the switch 106b and the capacitor 108b as the switch 106b is low impedance; also, the parallel of the switch 106b and the capacitor 108b will effectively make the loss lower than either the switch 106b or the capacitor 108b standing alone). When the capacitor 108b is coupled in series with the resonator 110b, the effective $F_R$ of the switchable resonator circuit 100b may be shifted to a higher frequency.

FIG. 1C illustrates a switchable resonator circuit 100c according to an example. The switchable resonator circuit 100c is similar to the switchable resonator circuit 100a of FIG. 1A except that the inductor 108a has been substituted for an impedance 100c. The switchable resonator circuit 100c includes a first contact 102c, a second contact 104c, a switch 106c, an impedance 108c, and a resonator 110c.

The first contact 102c is coupled to the switch 106c and the impedance 108c. The switch 106c and the impedance 108c are coupled to the resonator 110c. In some examples, the switch 106c and the impedance 108c are coupled in parallel with one another to the resonator 110c. The resonator 110c is coupled to the second contact 104c.

The impedance 108c may be any type of circuit element that has an impedance, including an inductor, a capacitor, a resistor, a resistor in series and/or parallel with a capacitor and/or inductor, and so forth. In many examples, the impedance 108c has a reactance. As with an inductor or other impedance, the impedance 108c may be frequency dependent, such that the impedance of the impedance 108c may depend on frequency.

When the impedance 108c is coupled in series to the resonator 110c (that is, when the switch 106c is open), depending on whether the impedance 108c is capacitive or inductive, the effective $F_R$ of the resonator may either be shifted to a higher frequency or a lower frequency.

With respect to FIGS. 1B and 1C, the impedance 108c and the capacitor 108b may be used to adjust the frequency-related characteristics of the respective resonators 110b, 110c in a manner similar or identical to the inductor 108a of FIG. 1A.

Figure 2A:
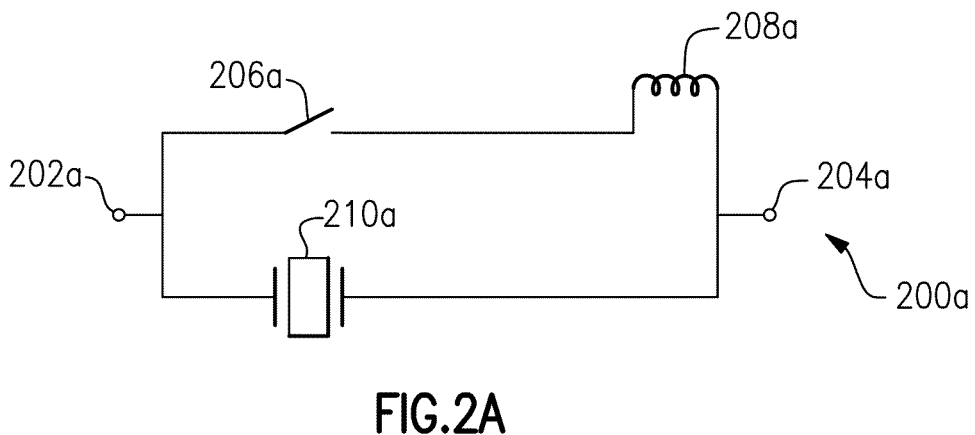
FIG. 2A illustrates a switchable resonator according to an example.
Figure 2B:
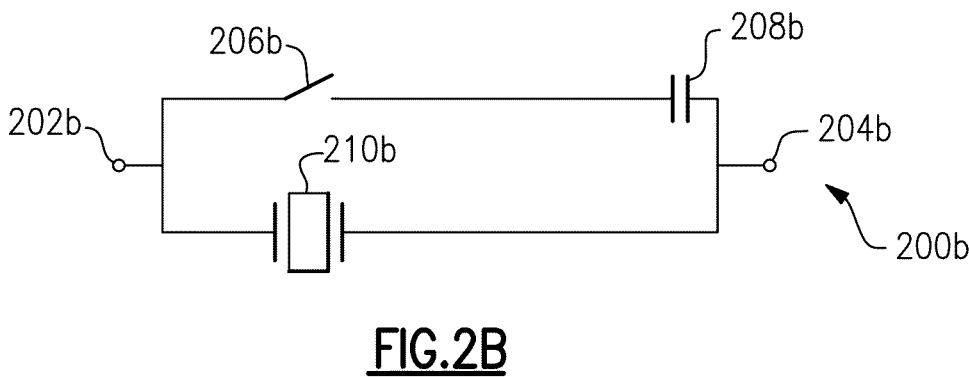
FIG. 2B illustrates a switchable resonator according to an example.
Figure 2C:
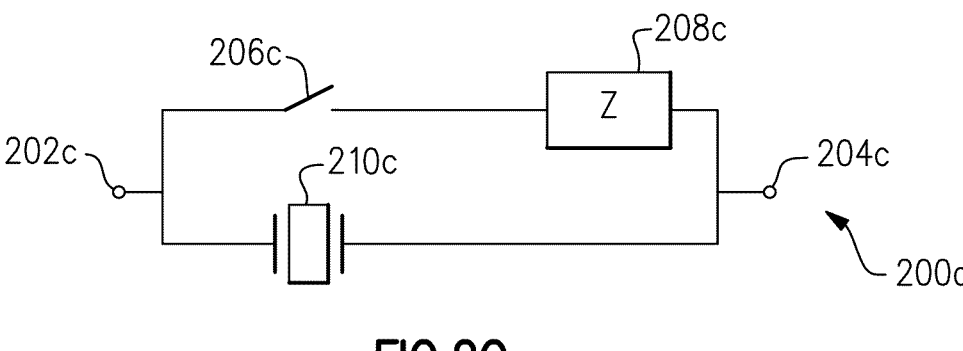
FIG. 2C illustrates a switchable resonator according to an example.

FIGS. 2A-C illustrate resonators coupled in parallel with reactive elements (such as inductors, capacitors, and/or other kinds of impedances).

FIG. 2A illustrates a switchable resonator circuit 200a according to an example. The switchable resonator circuit 200a includes a first contact 202a, a second contact 204a, a switch 206a, an inductor 208a, and a resonator 210a. The first contact 202a is coupled to the switch 206a and the resonator 210a. The switch 206a is coupled to the inductor 208a. The second contact 204a is coupled to the inductor 208a and the resonator 210a.

When the inductor 208a is coupled in parallel with the resonator 210a (that is, when the switch 206a is closed), effective $F_A$ of the resonator circuit 200a may be shifted to a higher frequency.

FIG. 2B illustrates a switchable resonator circuit 200b according to an example. The switchable resonator circuit 200b includes a first contact 202b, a second contact 202b, a switch 206b, a capacitor 208b, and a resonator 210b. The first contact 202b is coupled to the switch 206b and the resonator 210b. The switch 206b is coupled to the capacitor 208b. The second contact 204b is coupled to the capacitor 208b and the resonator 210b.

When the capacitor 208b is coupled in parallel with the resonator 210b (that is, when the switch 206b is closed), the effective $F_A$ of the resonator circuit 200b may be shifted to a lower frequency.

FIG. 2C illustrates a switchable resonator circuit 200c according to an example. The switchable resonator circuit 200c includes a first contact 202c, a second contact 202c, a switch 206c, an impedance 208c, and a resonator 210c. The first contact 202c is coupled to the switch 206c and the resonator 210c. The switch 206c is coupled to the impedance 208c. The second contact 204c is coupled to the impedance 208c and the resonator 210c.

When the impedance 208c is coupled in parallel with the resonator 210c (that is, when the switch 206c is closed), depending on whether the impedance 208c is capacitive or inductive, the effective $F_A$ of the resonator circuit 200c may be shifted to a lower or higher frequency.

Each switchable resonator circuit 200a, 200b, 200c operates in a similar manner to the switchable resonator circuits 100a, 100b, 100c of FIGS. 1A-C. In particular, the switches 206a, 206b, 206c may be any type of switching device. The inductor 208a, capacitor 208b, and impedance 208c may adjust the filtering characteristics of their respective resonators 210a, 210b, 210c.

One difference is that, whereas with FIGS. 1A-C, the switches 106a, 106b, 106c and respective inductor 108a, capacitor 108b, or impedance 108c were coupled in parallel with one another, and collectively, in series with the resonator 110a, 110b, and 110c, in FIGS. 2A-C the respective switches 206a, 206b, 206c and inductor 208a, capacitor 208b, or impedance 208c are coupled in series with each other, and the series connection is coupled in parallel with the respective resonator 210a, 210b, 210c. Thus, the way each configuration 100a, 100b, 100c, 200a, 200b, 200c affects $F_R$ and/or $F_A$ may vary as described above. Fundamentally, an inductive component coupled in series with a resonator shifts $F_R$ to a lower frequency, and an inductive component coupled in parallel with a resonator shift $F_A$ to a higher frequency. In turn, a capacitive component coupled in series with a resonator shifts $F_R$ to a higher frequency, and a capacitive component coupled in parallel with a resonator shifts $F_A$ to a lower frequency. Combinations of inductors and capacitors, coupled in parallel or in series, have cumulative effects. For example, a resonator having a capacitor coupled in parallel and an inductor coupled in series would have $F_R$ shifted to a lower frequency and $F_A$ shifted to a lower frequency. A resonator having an inductor coupled in parallel and an inductor coupled in series would have $F_R$ shifted to a lower frequency and $F_A$ shifted to a higher frequency.

Thus, the switches of FIGS. 1A-1C and FIGS. 2A-2C allow for selective coupling of resonators to reactive elements, and thus, combinations of the included circuits allow for $F_R$ and $F_A$ to be selectively adjusted according to the desires of a user or the needs of a particular application.

In the foregoing discussion, and hereafter, the affects on $F_A$ and $F_R$ generally refer to the effective—that is, overall—$F_A$ and $F_R$ for the circuits 100a, 100b, 100c, 200a, 200b, 200c shown as a whole. That is, in most examples, the actual resonators 110a, 110b, 110c, 210a, 210b, 210c are fixed designs for which $F_R$ and $F_A$ changes as a result of the operation of the respective switches shown in each overall circuit. However, in some examples, the resonators discussed herein may be adjustable or even may represent switchable resonator circuits themselves.

Figure 3A:
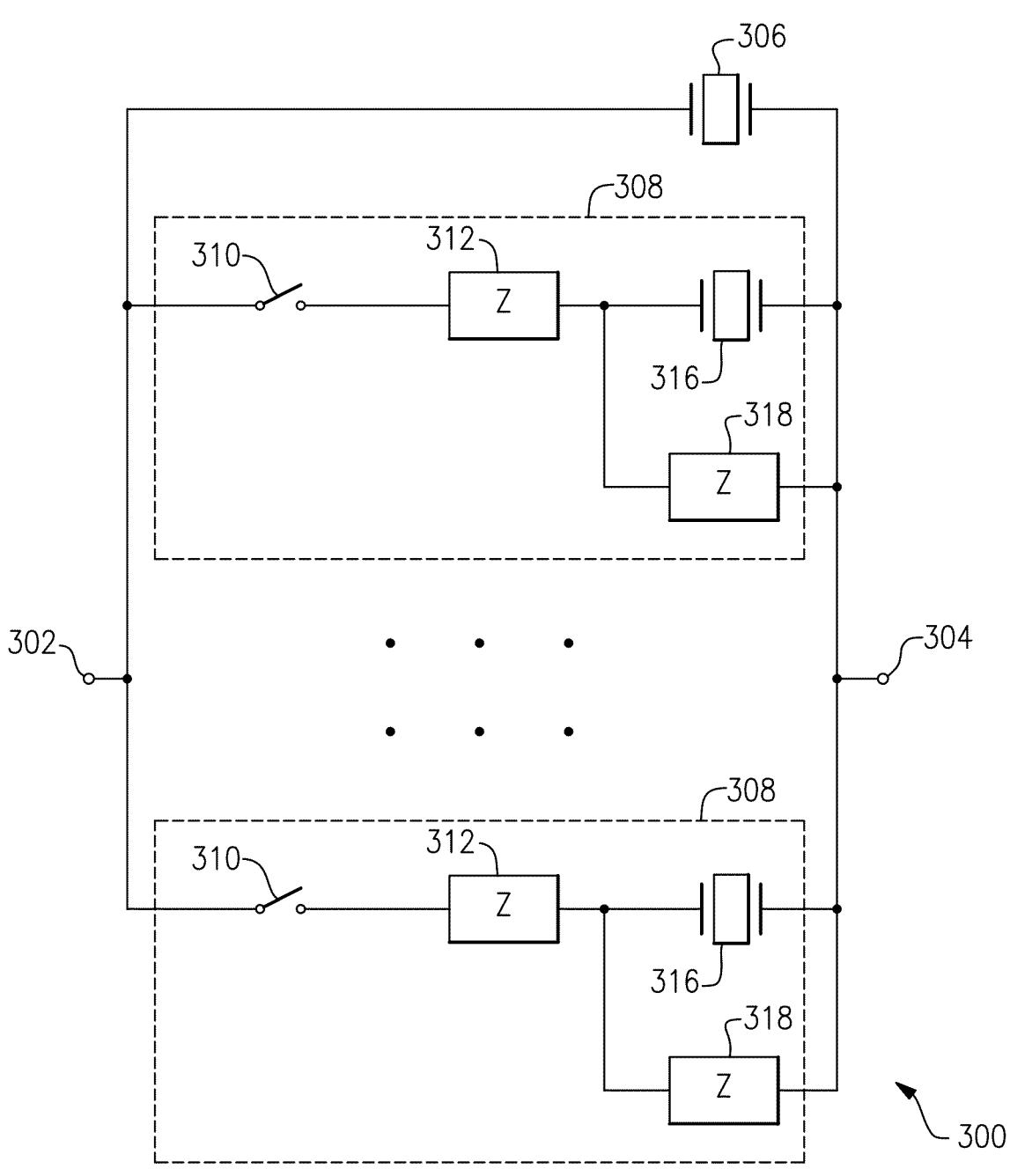
FIG. 3A illustrates a switchable resonator topology according to an example.

FIG. 3A illustrates a switchable parallel resonator topology 300 according to an example. The switchable resonator 300 includes a first contact 302, a second contact 304, a stand-alone resonator 306, and one or more switchable resonators 308. The one or more switchable resonators 308 may include a switch 310, a first impedance 312, a resonator 316, and a second impedance 318.

The first contact 302 is coupled to the stand-alone resonator 306 and each of the one or more switchable resonators 308. In some examples, the first contact 302 is coupled to the switch 310 of each of the one or more switchable resonators 308. The second contact 304 is coupled to the stand-alone resonator 306, and each of the one or more switchable resonators 308. In some examples, the second contact 304 is coupled to the resonator 316 and second impedance 318 of each of the one or more switchable resonators 308.

The switch 310 is coupled to the first impedance 312. The first impedance is coupled to the resonator 316 and the second impedance 318. In some examples, the resonator 316 and second impedance 318 are coupled in parallel with one another to the first impedance 312.

The stand-alone resonator 306 may be selectively coupled in parallel with one or more of the one or more switchable resonators 308 via one or more respective switches 310. The resonator 316 does not need to match the stand-alone resonator 306 (that is, resonator 316 and stand-alone resonator 306 may have different $F_R$ and $F_A$). The impedances 312, 318 may further adjust $F_R$ and $F_A$ of the resonator 316 (and each switchable resonator of the one or more switchable resonators 308 may have different impedances 312, 318, and different native $F_R$ and $F_A$, such that each switchable resonator is unique compared to each other switchable resonator).

Note that any given impedance 312, 318 may be omitted from a given switchable resonator of the one or more switchable resonators 308. For example, the second impedance 318 could be omitted (and the parallel branch the second impedance 318 occupies could be deleted). Likewise, the first impedance 312 could be removed and replaced with just a conducting line coupling the switch 310 directly to the resonator 316 and/or second impedance 318 for one or more of the one or more switchable resonators 308.

Figure 3B:
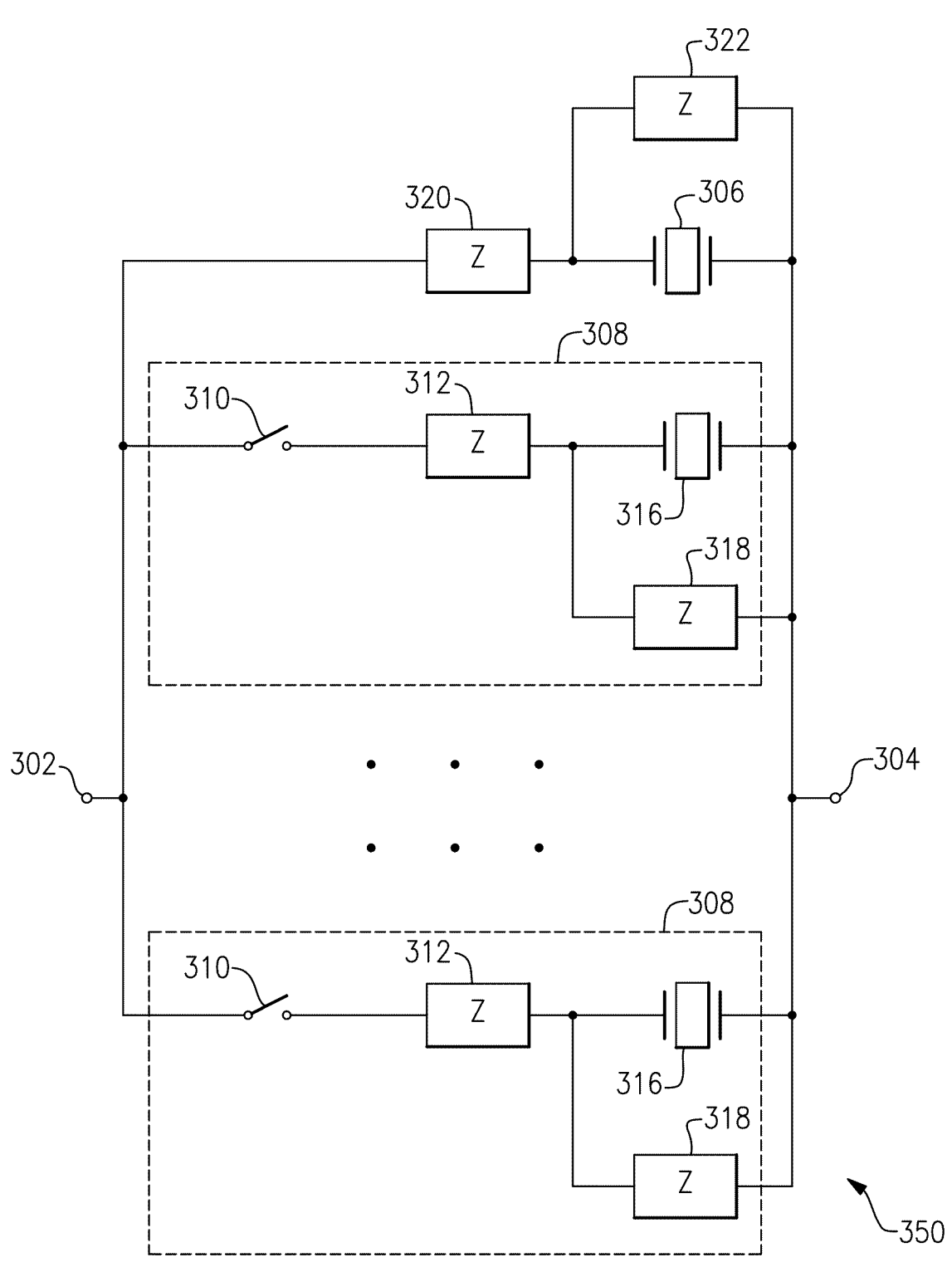
FIG. 3B illustrates a switchable resonator topology according to an example.

FIG. 3B illustrates a switchable parallel resonator topology 350 according to an example. FIG. 3B is identical to FIG. 3A except for the addition of two impedances, a first impedance 320 and a second impedance 322. The first impedance 320 is coupled to the first contact 302 and to the stand-alone resonator 306 and the second impedance 322. The second impedance is coupled to the first impedance 320, the stand-alone resonator 306, and the second contact 304. In some examples, the second impedance 322 and the stand-alone resonator 306 are coupled in parallel with one another to the second contact 304. The presence of the first and second impedances 320, 322 may further adjust the frequency response of the circuit in accordance with the changes to $F_R$ and $F_A$ described above with respect to FIGS. 1A-C and 2A-C, depending on the type and position of the impedances 320, 322.

Figure 4:
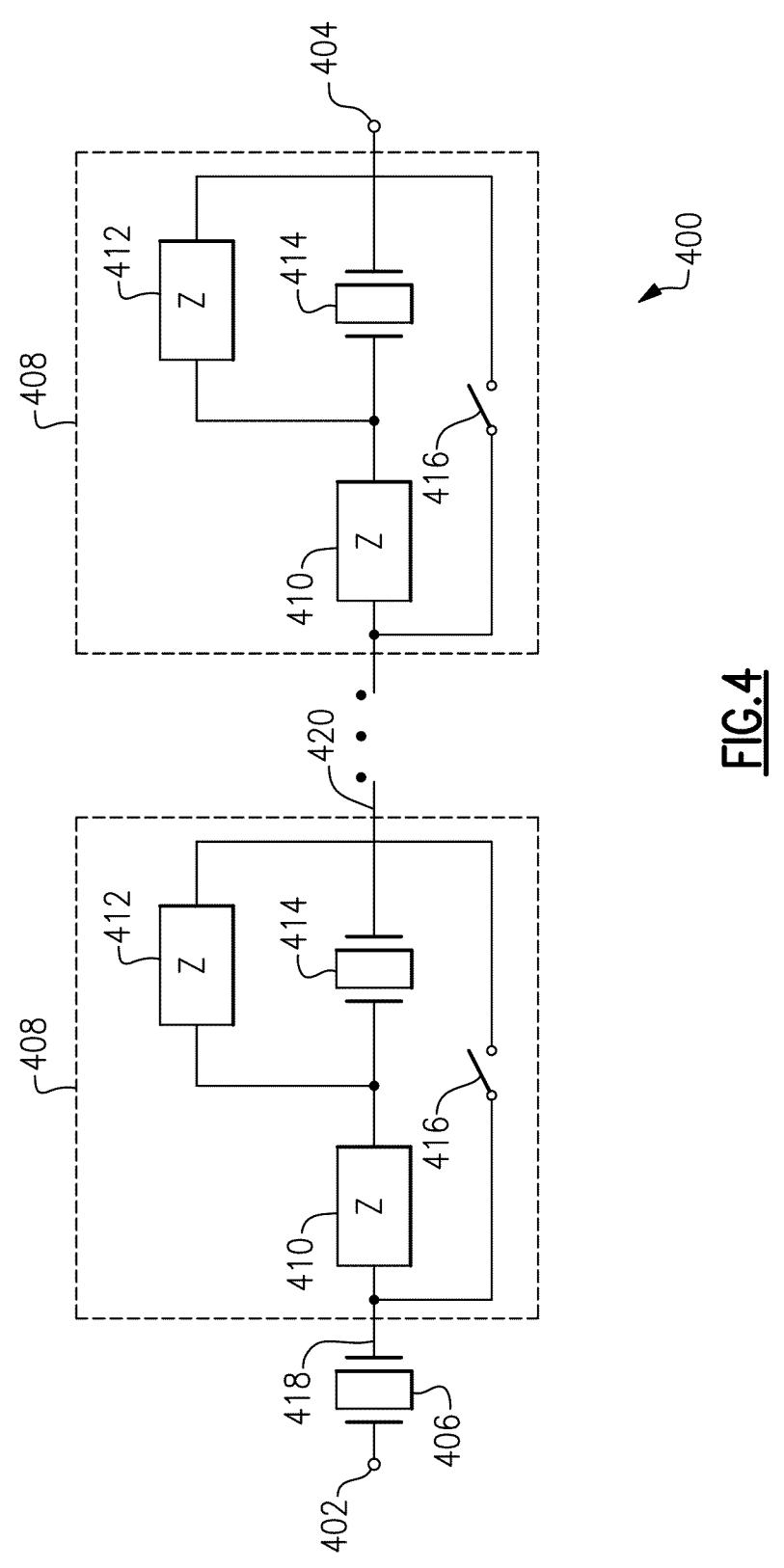
FIG. 4 illustrates a cascade resonator topology according to an example.

FIG. 4 illustrates a switchable series (or cascade) resonator topology 400 according to an example. The resonator topology 400 includes a first contact 402, a second contact 404, a stand-alone resonator 406, and one or more switchable resonators 408. The respective switchable resonators of the one or more switchable resonators 408 include a first impedance 410, a second impedance 412, a resonator 414, and a switch 416.

The first contact 402 is coupled to the stand-alone resonator 406. The stand-alone resonator is coupled in series to a switchable resonator of the one or more switchable resonators 408. Each switchable resonator of the one or more switchable resonators 408 is coupled in series with at least one other switchable resonator of the one or more switchable resonators 408 between the first contact 402 and the second contact 404. At least one switchable resonator of the one or more switchable resonators 408 is coupled to the second contact 404.

Within each switchable resonator of the one or more switchable resonators 408, the first impedance 410 may be coupled to the second impedance 412, the resonator 414, and the switch 416. The second impedance 412 may be coupled in parallel with the resonator 414. The parallel combination of the second impedance 412 and the resonator 414 may be coupled to the first impedance 410 and to the switch 416. In some examples, the switchable resonators have a first contact point 418 and a second contact point 420. In some examples, the second contact point 420 of one or more of the one or more switchable resonators 408 may be coupled to the first contact point 418 of another switchable resonator of the one or more switchable resonators 408 or to the second contact 404. In some examples, the first contact point 418 of one or more of the one or more switchable resonators 408 may be coupled to the second contact point 420 of another switchable resonator of the one or more switchable resonators 408 and/or to the stand-alone resonator 406.

The switch 416 of a resonator of the one or more switchable resonators 408 controls how the switchable resonator functions. That is, when the switch 416 is in an open state, the conducting path through the switchable resonator includes the impedances 410, 412 and resonator 414. When the switch 416 is in a closed state, the conducting path through the switchable resonator is branched into two parallel paths, with the first path being through switch 416, and the second path being through impedance 410 in cascade of the parallel of impedance 412 and resonator 414. Because of this parallel branching, the overall resistance is smaller than either path, hence the insertion loss of the switch's 416 on-resistance is essentially not showing up.

Figure 5:
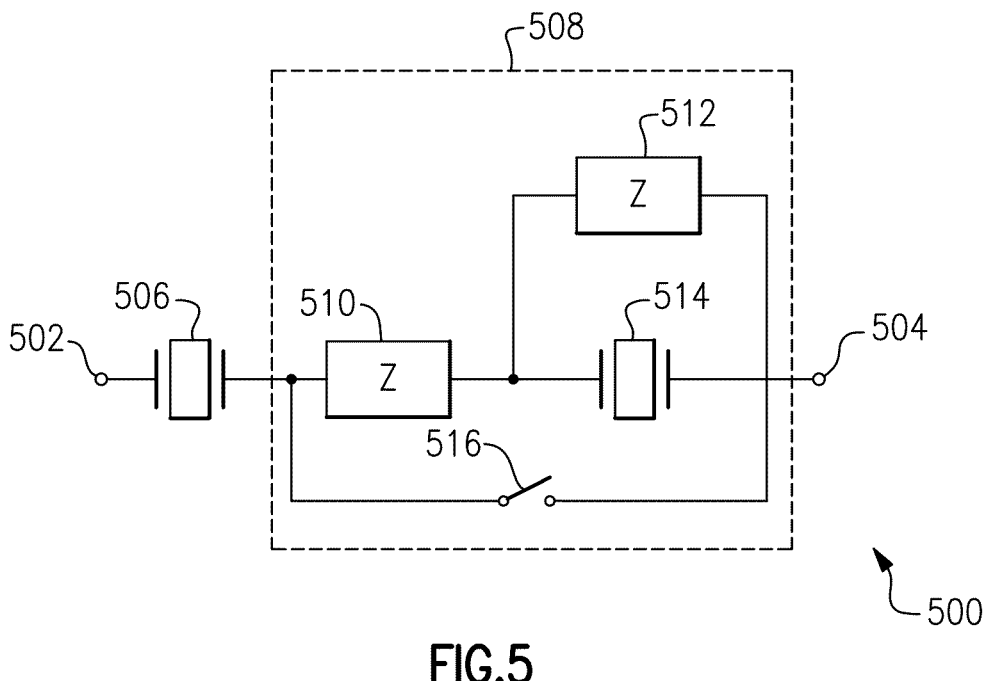
FIG. 5 illustrates a switchable resonator according to an example.

FIG. 5 illustrates a switchable resonator 500 according to an example. The switchable resonator 500 includes a first contact 502, a second contact 504, a stand-alone resonator 506, and a switchable resonator 508. The switchable resonator 508 includes a first impedance 510, a second impedance 512, a resonator 514, and a switch 516.

The first contact 502 is coupled to the stand-alone resonator 506. The stand alone resonator 506 is coupled in series to the switchable resonator 508. In some examples, the stand-alone resonator 506 is coupled to one or more of the first impedance 510, the second impedance 512, and the switch 516. The second contact 504 is coupled to the switchable resonator 508. In some examples, the second contact 504 is coupled to one or more of the second impedance 512, resonator 514, and switch 516.

When the switch 516 is in the open state, the conducting path through the switchable resonator 500 includes the first resonator 506, the first impedance 510, second impedance 512, and resonator 514. When the switch 516 is in the closed state, the conducting path through the switchable resonator 500 is the cascade of stand-alone resonator 506 and switchable resonator 508, where switchable resonator 508 is a three-way parallel of the second impedance 512, the switch 516 and the combination of the cascade of the first impedance 510 and the resonator 514. For the switchable resonator 508 with switch 516 in a closed state, the impedance of the switch 516 is dominant as it is low impedance; however, the overall effective series resistance will be lower than any of the three paths due to parallel connection.

In FIG. 5, the stand-alone resonator 506 may be omitted in some examples.

In some examples, the switchable resonator 500 may substitute some or all of the one or more switchable resonators 408 of FIG. 4. The switchable resonator 500 has a different topology from the switchable resonators of FIG. 4 in that the second impedance 512 may be coupled in parallel with the switch 516 and the series combination of the first impedance 510 and the resonator 514. That is, whereas in FIG. 4, the second impedance 412 was coupled at least in part between the first impedance 410 and the resonator 414, in FIG. 5 the second impedance 512 is not necessarily coupled in part between the first impedance 510 and the resonator 514.

Figure 6:
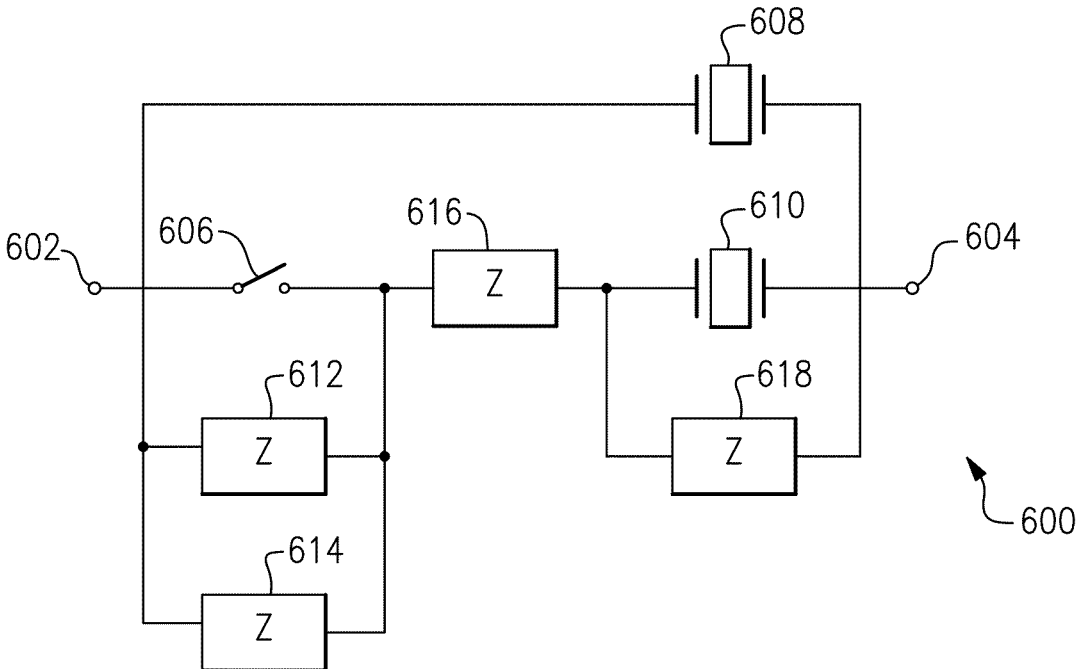
FIG. 6 illustrates a switchable resonator according to an example.

FIG. 6 illustrates a switchable resonator 600 according to an example. The switchable resonator 600 includes a first contact 602, a second contact 604, a switch 606, a first resonator 608, a second resonator 610, a first impedance 612, an optional second impedance 614, a third impedance 616, and a fourth impedance 618.

The first contact 602 is coupled to the first resonator 608, the switch 606, the first impedance, and optionally the optional second impedance 614. The switch 606, first impedance 612, and optional second impedance 614 are coupled together in parallel with respect to the first contact 602 and the third impedance 616. The third impedance is coupled to the second resonator 610 and the fourth impedance 618. The first resonator 608, second resonator 610, and fourth impedance 618 are coupled to the second contact 604.

In some examples, the first impedance 612 and optional second impedance 614, being connected in parallel with the switch 606 with respect to the first contact 602 and the third impedance 616, may be bypassed when the switch 606 is in a closed state. That is, in the closed state, the first and second impedances 612, 614 are barely part of the conducting path between the first contact 602 and the second contact 604 as the switch 606 is low impedance. In some examples, when the switch 606 is in an open state, the first impedance 612 and optional second impedance 614 are part of the conducting path between the first contact 602 and the second contact 604, and the first impedance 612 and second impedance 614 can form resonance at desired frequency with the off-capacitance of the switch 606 to provide a higher impedance for the open state.

Figure 7A:
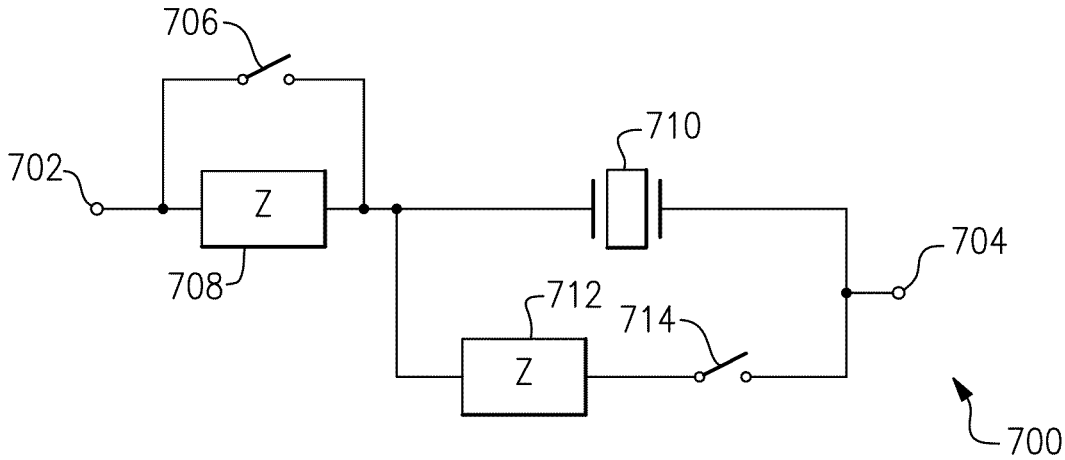
FIG. 7A illustrates a switchable resonator according to an example.
Figure 7B:
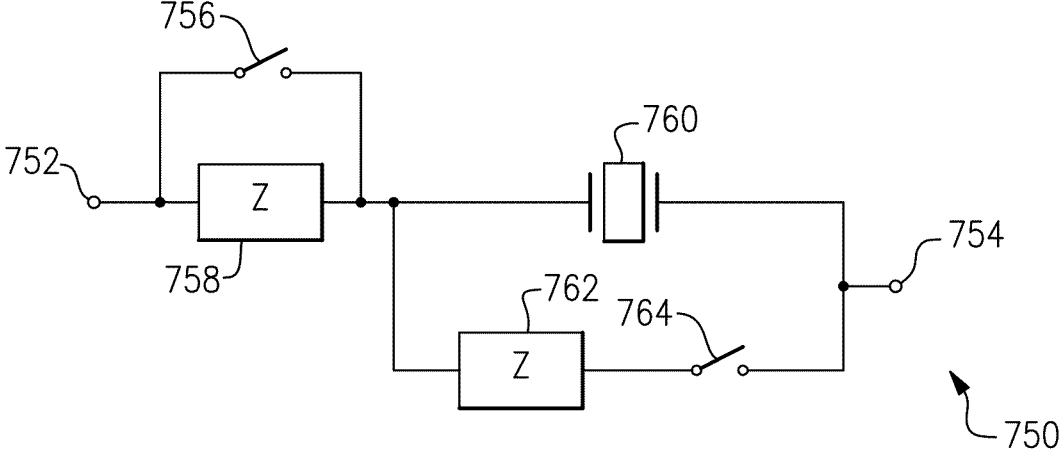
FIG. 7B illustrates a switchable resonator according to an example.

FIGS. 7A and 7B illustrate two more examples of a switchable resonator.

FIG. 7A illustrates a switchable resonator 700 according to an example. The switchable resonator 700 includes a first contact 702, a second contact 704, a first switch 706, a first impedance 708, a resonator 710, a second impedance 712 and a second switch 714.

The first contact 702 is coupled to the parallel combination of the first switch 706 and the first impedance 708. The parallel combination of the first switch 706 and the first impedance 708 is coupled to the parallel combination of the resonator 710 with the series combination of the second impedance 712 and the second switch 714. The second contact 704 is coupled to the resonator 710 and the second impedance 712.

When the first switch 706 is in an open state, the first impedance 708 is part of the conducting path from the first contact 702 to the second contact 704. When the first switch is in a closed state, the first impedance 708 is largely bypassed (that is, is largely not part of the conducting path from the first contact 702 to the second contact 704) due to low impedance of the first switch 706.

When the second switch 714 is in an open state, the second impedance 712 is not part of the conducting path from the first contact 702 to the second contact 704. When the second switch 714 is in a closed state, the second impedance 712 is part of the conducting path from the first contact 702 to the second contact 704.

FIG. 7B illustrates a switchable resonator 750 according to an example. The switchable resonator 750 includes a first contact 752, a second contact 754, a first switch 756, a first impedance 758, a resonator 760, a second impedance 762, and a second switch 764.

The first contact 752 is coupled to the parallel combination of the first switch 756 and first impedance 758, and is also coupled to the second impedance 762. The second impedance 762 is coupled to the second switch 764, and the second switch 764 is coupled to the second contact 754. The resonator 760 is coupled to the second contact 754 and to the parallel combination of the first switch 756 and the first impedance 758.

When the first switch 756 is in an open state, the first impedance 758 is part of the conducting path from the first contact 752 to the second contact 754. When the first switch 756 is in a closed state, the first impedance 758 is largely bypassed (that is, is not a major part of the conducting path between the first contact 752 and the second contact 754) due to the low impedance of the first switch 756.

When the second switch 764 is in the open state, the second impedance 762 is not part of the conducting path between the first contact 752 and the second contact 754. When the second switch 764 is in the closed state, the second impedance 762 is part of the conducting path from the first contact 752 to the second contact 754.

Figure 8:
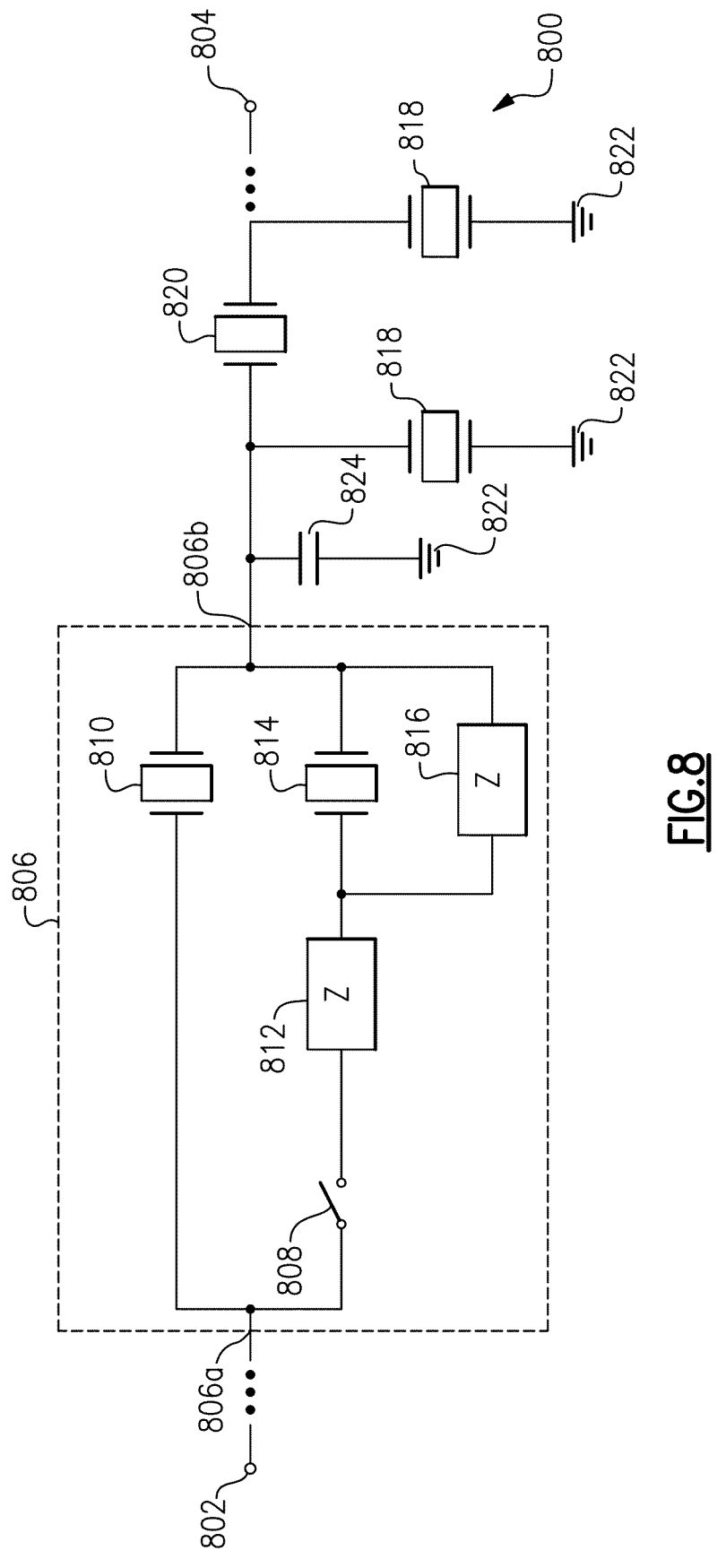
FIG. 8 illustrates a circuit having one or more switchable resonators coupled in cascade according to an example.

FIG. 8 illustrates a circuit 800 having one or more switchable resonators coupled in cascade with one or more resonators. The circuit 800 includes a first contact 802, a second contact 804, one or more switchable resonators 806, one or more first resonators 818 and one or more second resonators 820. In some examples, the circuit 800 may include a capacitor 824.

The first contact 802 is coupled to a switchable resonator of the one or more switchable resonators 806. Additional switchable resonators of the one or more switchable resonators 806 are coupled to at least one other switchable resonator of the one or more switchable resonators 806 in a series combination. At least one switchable resonator of the one or more switchable resonators 806 is coupled to at least one first resonator of the one or more first resonators 818 and at least one second resonator of the one or more second resonators 820. The capacitor 824, when present, may be coupled between a switchable resonator 806 and a first or second resonator of the one or more first or second resonators 818, 820.

Each first resonator of the one or more first resonators 818 is coupled to at least one second resonator of the one or more second resonators 820. Each second resonator of the one or more second resonators 820 is coupled to at least one first resonator of the one or more first resonators 818. In some examples, each second resonator is coupled to at least two first resonators.

The first resonators of the one or more first resonators 818 may be non-switchable resonators, and may each be coupled to a reference node 822. The second resonators of the one or more second resonators 820 may also be non-switchable resonators. In some examples, neither the one or more first resonators 818 nor the one or more second resonators 820 may be bypassed on the conducting path between the first contact 802 and the second contact 804.

Each switchable resonator of the one or more switchable resonators 806 includes a switch 808, a first impedance 812, a second impedance 816, a stand-alone resonator 810, and a resonator 814. The switchable resonators may also include a first connection 806a and a second connection 806b. The switch 808 and stand-alone resonator are coupled to the first connection 806a. The stand-alone resonator 810, resonator 814, and second impedance 816 are coupled to the second connection 806b, and the second connection 806b may be coupled to one or more of the one or more first resonators 818 and the one or more second resonators 820. The first connection 806a may be coupled to the first contact 802 or another resonator (switchable or static), and the second connection 806b may be coupled to another resonator (switchable or static) as well. The first impedance 812 may be coupled in series between the switch 808 and a parallel combination of the resonator 814 with the second impedance 816.

When the switch 808 is in an open state, the first impedance 812, second impedance 816, and resonator 814 are bypassed (that is, not part of the conducting path between the first contact 802 and the second contact 804). When the switch 808 is in a closed state, the impedances 812, 816 and resonator 814 are part of the conducting path between the first contact 802 and the second contact 808.

The one or more first resonators 818 may act as shunts that permit the passage of certain portions of a signal present on some or all of the conducting path between the first contact 802 and the second contact 804 to be redirected to the reference node 822. In some examples, the portions of the signal that are redirected by the one or more first resonators 818 will be determined by the frequency characteristics of the one or more first resonators 818.

The capacitor 824 may adjust an impedance of the circuit 800, for example to provide impedance matching with a load.

Figure 9A:
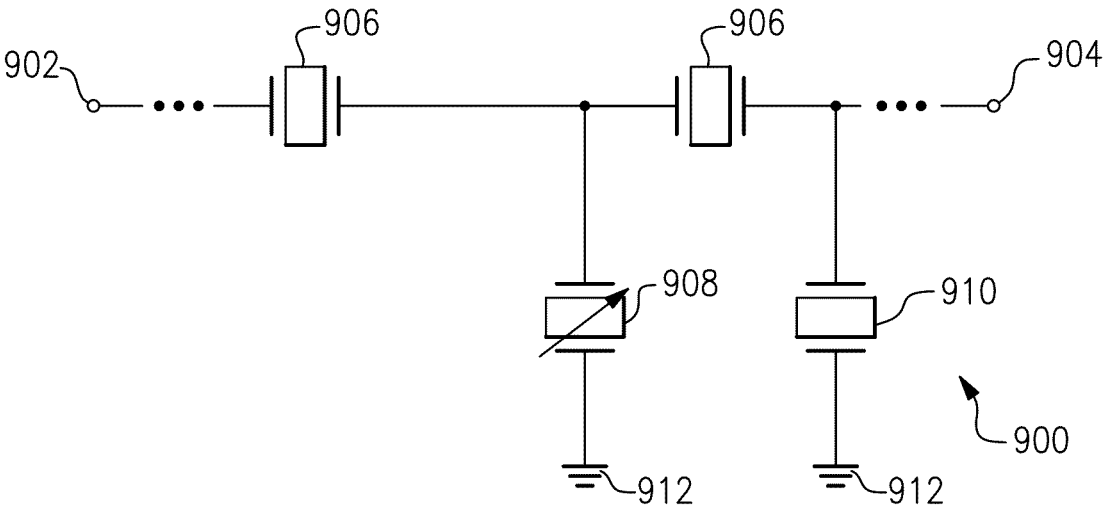
FIG. 9A illustrates a circuit according to an example.

FIG. 9A illustrates a circuit 900 according to an example. The circuit 900 includes a first contact 902, a second contact 904, a first plurality of resonators 906 arranged in a series topology, a second plurality of resonators 910 arranged in a shunt topology, and at least one switchable resonator 908 arranged in a shunt topology.

The first contact 902 is coupled to one of the resonators of the plurality of resonators 906. The resonators of the first plurality of resonators 906 are coupled to each other in series between the first contact 902 and the second contact 904. At least one switchable resonator 908 is coupled between two resonators of the first plurality of resonators 906 at one point and a reference node 912 at another point. In some examples, the at least one switchable resonator 908 is coupled in a shunt configuration between the reference node 912 and the conducting path between the first contact 902 and the second contact 904. The resonators of the second plurality of resonators 910 are coupled between one or more of the resonators of the first plurality of resonators 906 and the reference node 912.

The at least one switchable resonator 908 may be designed to be removed from the conducting path between the first contact 902 and the second contact 904 using one or more switches. That is, by operating the one or more switches of the at least one switchable resonator 908, the switchable resonator 908 may appear as an open circuit relative to the conducting path between the first contact 902 and the second contact 904. When the at least one switchable resonator 908 is part of the conducting path between the first contact 902 and the second contact 904, the at least one switchable resonator 908 may be used to divert certain components of an electrical signal on the conducting path to the reference node 912. The diverted components may be based on the frequency of the components.

In some examples, if there are more than one of the at least one switchable resonator 908, each switchable resonator may be operated independently.

Figure 9B:
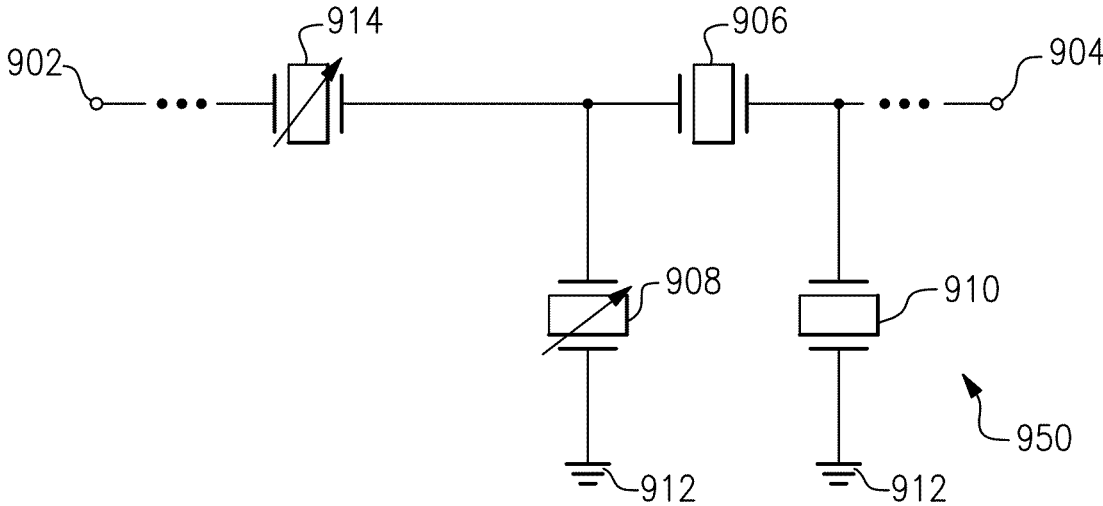
FIG. 9B illustrates a circuit according to an example.

FIG. 9B illustrates a circuit 950 according to an example. The circuit 950 is identical to the circuit 900 of FIG. 9A, except that some of the resonators of the first plurality of resonators have been replaced with one or more switchable resonators 914 ("switchable resonators 914").

The resonators of the switchable resonators 914 may be coupled in series with one another between the first contact 902 and the first plurality of resonators 906. The switchable resonators 914 may be operated using switches such that the switchable resonators 914 may be removed from the conducting path between the first contact 902 and the second contact 904. In some examples, when the switchable resonators 914 are disconnected from the conducting path, they appear as short circuits along the conducting path.

In both FIGS. 9A and 9B, the first plurality of resonators 906 and second plurality of resonators 910 are fixed resonators, meaning they have fixed frequency responses and other filtering characteristics.

Figure 10:
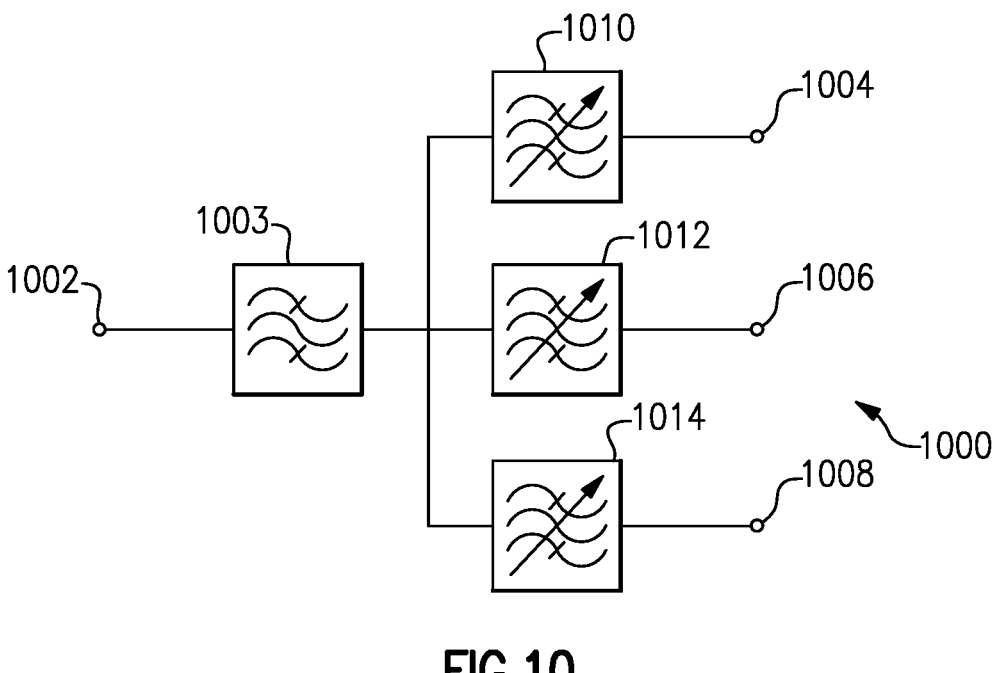
FIG. 10 illustrates a circuit according to an example.

FIG. 10 illustrates a circuit 1000 according to an example. The circuit 1000 includes a first contact 1002, a filter 1003, a second contact 1004, a third contact 1006, and a fourth contact 1008, as well as a first switchable filter 1010, a second switchable filter 1012, and a third switchable filter 1014.

The first contact 1002 is coupled to the filter 1003. The filter 1003 is coupled to each of the first, second, and third switchable filters 1010, 1012, 1014. The first switchable filter 1010 is coupled to the first contact 1004. The second switchable filter 1012 is coupled to the second contact 1006. The third switchable filter 1014 is coupled to the third contact 1008.

Each switchable filter 1010, 1012, 1014 includes at least one switchable resonator or switchable resonator topology, such as those described with respect to FIGS. 1A-9B. The switchable filters 1010, 1012, 1014 may also include other components, such as standard or traditional filtering components. The filter 1003 may be any type of filter, such as an LC filter providing low-pass, high-pass, band-pass, and/or band-reject filtering. Any of the filters 1003, 1010, 1012, 1014 may include any combination surface acoustic wave (SAW) and/or bulk acoustic wave (BAW) resonators.

The first contact 1002 may be a signal input, such as an antenna input for receiving (and possibly transmitting) a signal. The other contacts 1004, 1006, 1008 may also be signal inputs or outputs.

In an example of operation, a signal may be provided at the first contact 1002. The filter 1003 may filter and/or condition the signal, which then passes to one or more of the first, second, and third switchable filters 1010, 1012, 1014. Each switchable filter 1010, 1012, 1014 may be configured independently of the configuration of any other switchable filter. For example, any given switchable filter 1010, 1012, 1014 may be configured or operated in such a way that the signal bypasses some, all, or none of the switchable elements within the filter. The configuration of the given switchable filter does not need to have any bearing on the configuration of any other switchable filter in the circuit 1000. Referring to FIG. 9B as an example of a switchable filter, the first switchable filter 1010 may have an internal topology similar to that of circuit 950 of FIG. 9B. A signal may bypass each switchable resonator in the circuit 950 (for example, switchable resonators 908, 914) or only some of the switchable resonators, or none of the switchable resonators. So too, the signal may bypass some, all, or none of the switchable elements within the switchable filter 1010, or any other switchable filter (e.g., switchable filters 1012, 1014).

One the signal is filtered, the signal may be provided to another contact 1004, 1006, 1008 and used for whatever purpose the user desires.

Figure 11:
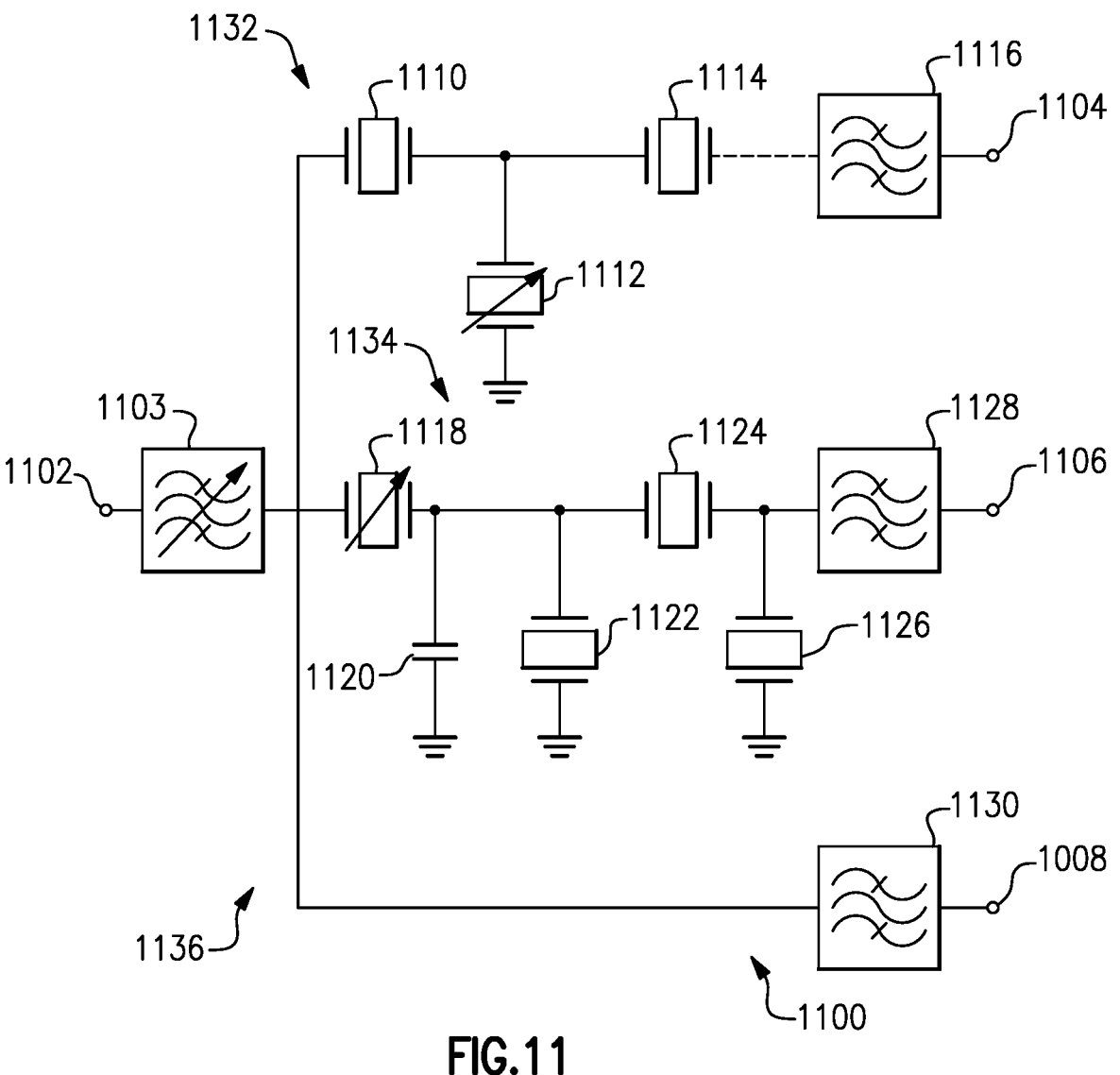
FIG. 11 illustrates a circuit topology according to an example.

FIGS. 11-13 illustrate specific circuit topologies using switchable resonators and filters.

FIG. 11 illustrates one possible topology for a circuit 1100 similar to the circuit 1000 of FIG. 10. The circuit 1100 includes a first contact 1102, a second contact 1104, a third contact 1106, a further contact 1108, a filter 1103, a first resonator 1110, a first switchable resonator 1112, a second resonator 1114, a first filter 1116, a second switchable resonator 1118, a capacitor 1120, a third resonator 1122, a fourth resonator 1124, a fifth resonator 1126, a second filter 1128, and a third filter 1130. The circuit 1100 may be divided into three branches including a first branch 1132, a second branch 1134, and a third branch 1136. The first branch 1132 may correspond to the branch of the circuit 1100 containing the first resonator 1110, the first switchable resonator 1112, the second resonator 1114, and the first filter 1116. The second branch 1134 may correspond to the branch of the circuit 1100 containing the second switchable resonator 1118, the capacitor 1120, the third, fourth, and fifth resonators 1122, 1124, 1126, and the second filter 1128. The third branch 1136 may correspond to the portion of the circuit containing the third filter 1130.

The first contact 1102 is coupled to the filter 1103. The filter is coupled to the first resonator 1110, the second switchable resonator 1118, and the third filter 1130. The third filter 1130 is coupled to the fourth contact 1108. The first resonator 1110 is coupled to the second resonator 1114 and the first switchable resonator 1112. The first switchable resonator 1112 is coupled to a reference node. The second resonator 1114 is coupled to the first filter 1116, and the first filter 1116 is coupled to the second contact 1104.

The second switchable resonator 1118 is coupled to the capacitor 1120 and the third resonator 1122 and the fourth resonator 1124. The capacitor 1120 and third resonator 1122 are both coupled to the reference node. The fourth resonator 1124 is coupled to the fifth resonator 1126 and the second filter 1128. The fifth resonator 1126 is coupled to the reference node. The second filter 1128 is coupled to the third contact 1106.

The circuit 1100 may be bidirectional, such that signals may be received and/or transmitted at any contact 1102, 1104, 1106, 1108. In one example of operation, a signal received at the first contact 1102 may be conditioned (or filtered) and provided to one or more of the second, third, and/or fourth contact 1104, 1106, 1108.

The signal may travel along any or all of the branches of the circuit 1100. That is, the signal may be provided to the first branch 1132, the second branch 1134, and/or the third branch 1136, and conditioned according to the components associated with said branches. In operation, the second branch 1134 may be like (or even replaced with) the circuits shown in FIG. 8, 9A, or 9B or with variations or portions of said circuits. The switchable resonators 1112, 1118 may also be any switchable resonator topology shown within this document. For example, the first switchable resonator 1112 may be a resonator topology like those shown in FIG. 4 or 5 or elsewhere (that is, switchable resonator 508 of FIG. 5 or switchable resonator 408 of FIG. 4, and so forth). Similarly, the second switchable resonator 1118 may be any switchable resonator topology shown in this application (for example, switchable resonator 806 of FIG. 8).

Figure 12A:
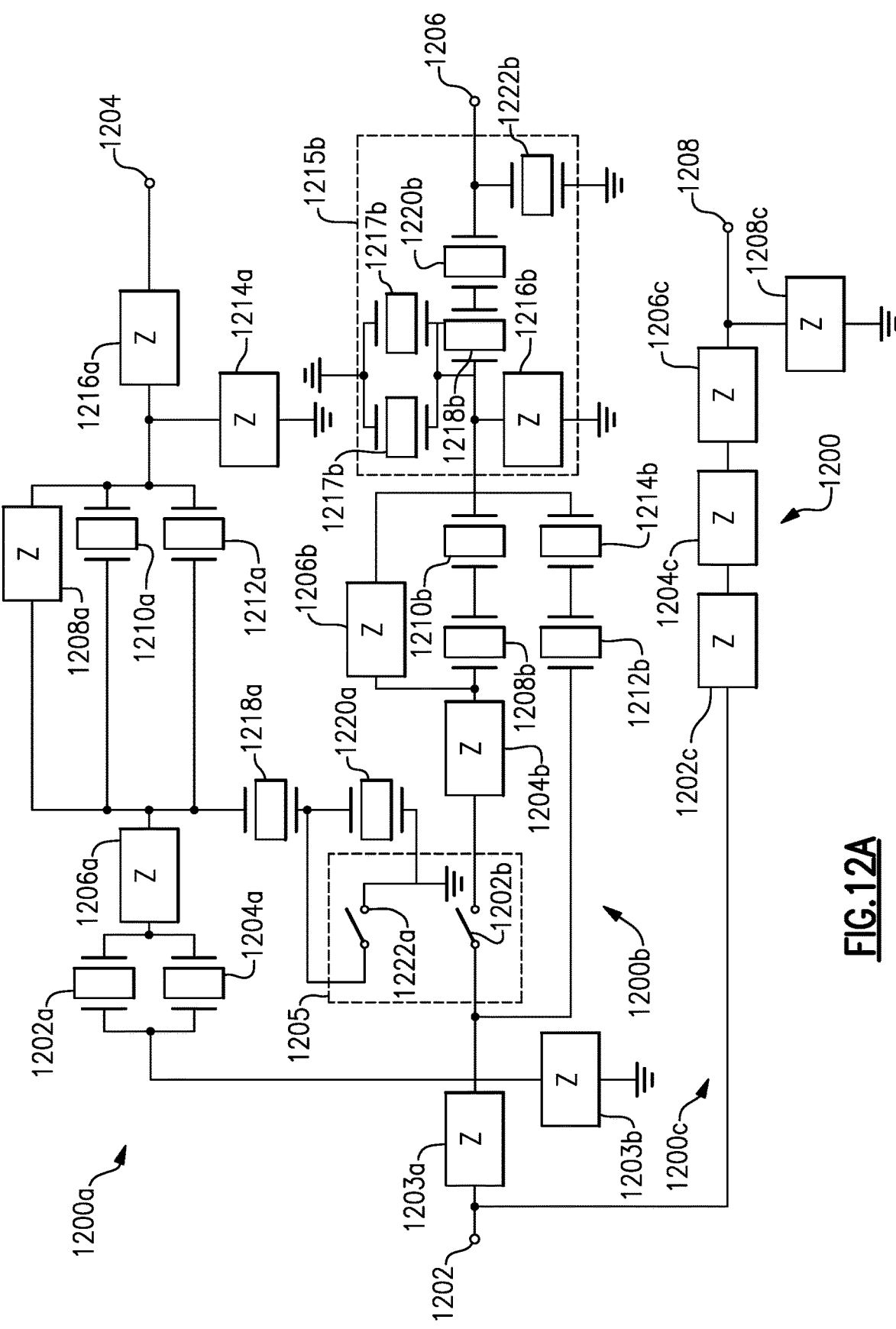
FIG. 12A illustrates a circuit having a module according to an example.

FIG. 12A illustrates a circuit 1200 according to an example. The circuit 1200 may be used as a triplexer or for other purposes. The circuit 1200 includes multiple components that will be discussed in greater detail below. As with FIG. 11 and FIG. 10, the circuit 1200 of FIG. 12 has three branches, including a first branch 1200a, a second branch 1200b, and a third branch 1200c.

The first branch 1200a includes a first resonator 1202a, a second resonator 1204a, a first impedance 1206a, a second impedance 1208a, a third resonator 1210a, a fourth resonator 1212a, a third impedance 1214a, a fourth impedance 1216a, a fifth resonator 1218a, a sixth resonator 1220a, and a switch 1222a.

The second branch 1200b includes a switch 1202b, a first impedance 1204b, a second impedance 1206b, a first resonator 1208b, a second resonator 1210b, a third resonator 1212b, a fourth resonator 1214b, a third impedance 1216b, a fifth resonator 1218b, a sixth resonator 1220b, and a seventh resonator 1222b. The third impedance 1216b and fifth through seventh resonators 1218b, 1220b, 1222b are part of a module 1215b.

The third branch 1200c includes a first impedance 1202c, a second impedance 1204c, a third impedance 1206c, and a fourth impedance 1208c.

The circuit 1200 also includes a contact 1202, a first contact 1204, a second contact 1206, a third contact 1208, a first impedance 1203a, a second impedance 1203b, and a switch die 1205.

In FIG. 12A, each impedance (represented by a box containing the letter "Z") may be any impedance including an impedance formed by the parallel and/or series coupling of capacitors, resistors, and/or inductors with one another. The various resonators, similarly, may represent one or more resonators connected in series and/or parallel with one another.

The contact 1202 is coupled to the first impedance 1203a and the first impedance 1202c of the third branch 1200c. With respect to the third branch 1200c, the first impedance 1202c of the third branch 1200c is coupled to the second impedance 1204c (of the third branch 1200c). The second impedance 1204c is coupled to the third impedance 1206c. The third impedance 1206c is coupled to the fourth impedance 1208c and the third contact 1208. The fourth impedance 1208c is coupled to a reference node.

The first impedance 1203a is also coupled to the second impedance 1203b. The second impedance 1203b is coupled to ground. Furthermore, the second impedance 1203b and first impedance 1203a are also coupled to the first resonator 1202a and second resonator 1204a of the first branch 1200a, as well as to the switch 1202b of the second branch 1200b and to the third resonator 1212b of the second branch 1200b.

With respect to the first branch 1200a, the first and second resonators 1202a, 1202b are coupled to each other in parallel and are coupled to the first impedance 1206a. The first impedance 1206a is coupled to the second impedance 1208a, the fourth resonator 1212a, the third resonator 1210a, and the fifth resonator 1218a. The fifth resonator 1218a is coupled to the sixth resonator 1220a and to one terminal of the switch 1222a of the first branch 1200a. The sixth resonator 1220a is coupled to another terminal of the switch 1222a. In some examples, the second impedance 1208a and third and fourth resonators 1210a, 1212a are coupled in parallel with one another. Each of the second impedance 1208a and third and fourth resonators 1210a, 1212a are coupled to the third and fourth impedances 1214a, 1216a. The third impedance 1214a is coupled to the reference node. The fourth impedance 1216a is coupled to the first contact 1204. Finally, the switch 1222a is coupled to the reference node. In some examples, the switch 1222a is coupled to the reference node at the terminal that is coupled to the fifth resonator 1218a.

With respect to the second branch 1200b, the first impedance 1204b is coupled to the second impedance 1206b and to the first resonator 1208b. The first resonator 1208a is coupled to the second resonator 1210b. The third resonator 1212b may be coupled to the switch 1202b at a terminal different than the terminal where the first impedance 1204b is coupled to the switch 1202b. The third resonator 1212b is also coupled to the fourth resonator 1214b. The second and fourth resonators 1210b, 1214b are coupled to the module 1215b. In some examples, the second and fourth resonators 1210b, 1214b are coupled to the third impedance 1216b and the fifth resonator 1218b. The third impedance 1216b is coupled to the reference node. The fifth resonator 1218b is coupled to the sixth resonator 1220b, and the sixth resonator 1220b is coupled to the second contact 1206 and the seventh resonator 1222b. The seventh resonator 1222b is also coupled to the second contact 1206 and to the reference node. A pair of resonators 1217b are coupled between a reference node and one or all of the third impedance 1216b, the fifth resonator 1218b, the second resonator 1210b and the fourth resonator 1214b.

The switches 1222a, 1202b may be located on the same switch die 1205, while the resonators may be located on the same resonator die. The impedances may be inductive, resistive, and/or capacitive, and may be implemented as Surface Mount Technology (SMT) and/or embedded coils on the Multi Chip Module (MCM). In some examples the two switches 1222a, 1202b switch on and off simultaneously.

Certain impedances may have specific resonant frequencies. For example, the fourth impedance 1216a of the first branch 1200a may have a resonant frequency of 3.5G . . . .

For the first branch 1200a, there may be three or more conducting paths. A first conducting path extends between the first and second resonators 1202a, 1204a and the third impedance 1214a to a reference node. A second conducting path extends between the first and second resonators 1202a, 1204a and the fourth resonator 1216a to the first node 1204. A third conducting path extends between the first and second resonators 1202a, 1204a and the sixth resonator 1220a to a reference node when the second switch 1222a is open, and through the fifth resonator 1218a but not necessarily through the sixth resonator 1220a when the second switch 1222a is closed. When the switch 1222a is in an open position, the conducting path to the reference node coupled to the switch 1222a is from the fifth resonator 1218a of the first branch 1200a through the sixth resonator 1220a. When the switch 1222a is in the closed position, the conducting path to the reference node is altered such that the sixth resonator 1220a is no longer part of the conducting path to the reference node.

For the second branch 1200b, when the switch 1202b is in the open state, the first impedance 1204b, second impedance 1206b, first resonator 1208b, and second resonator 1210b are not part of the conducting path. When the switch 1202b is in the closed state, the first impedance 1204b, second impedance 1206b, first resonator 1208b, and second resonator 1210b are part of the conducting path.

Figures 12B, 12C:
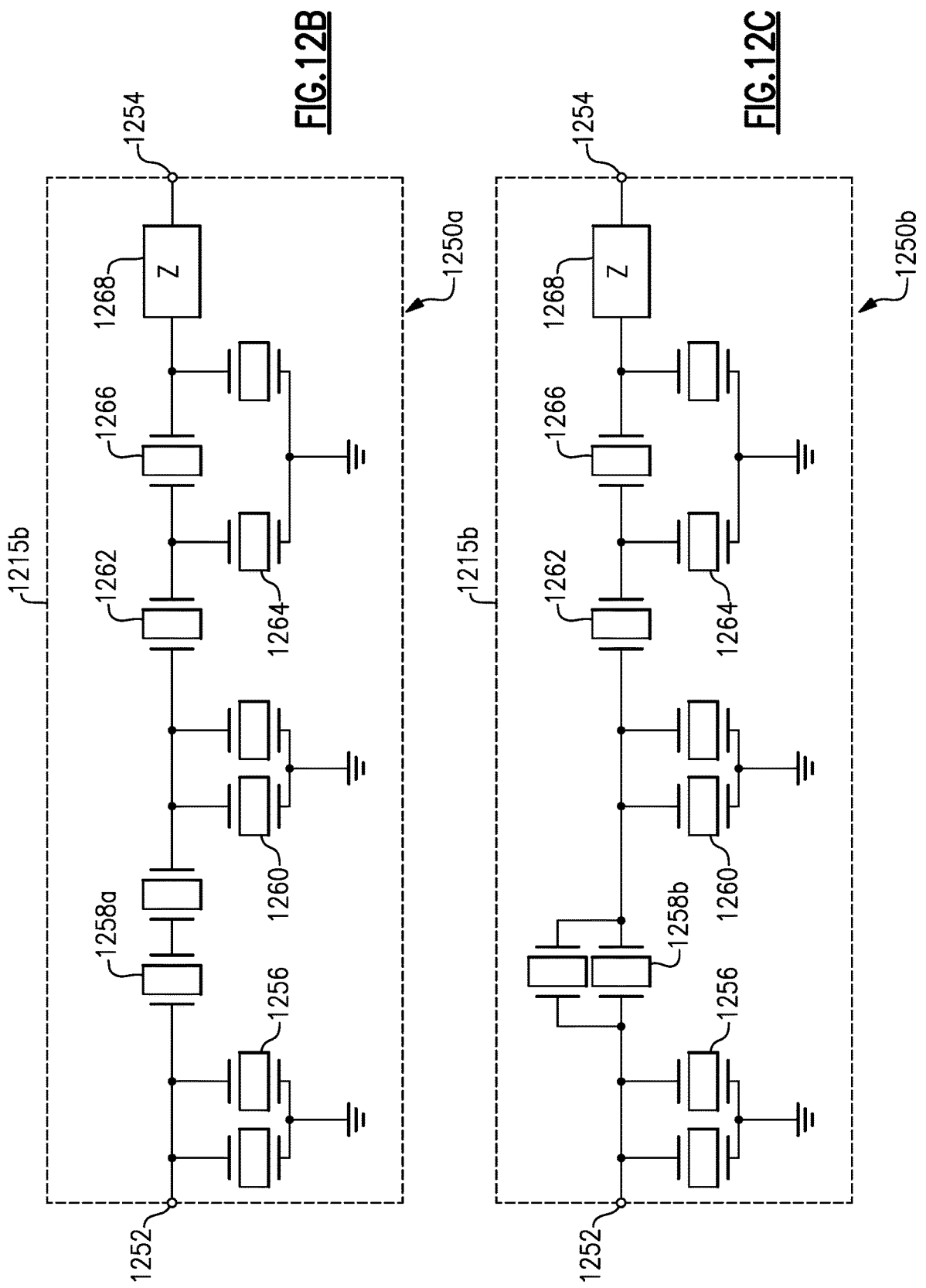
FIG. 12B illustrates a module according to an example.
FIG. 12C illustrates a module according to an example.

The module 1215b may contain resonators and/or impedances arranged in various configurations. FIGS. 12B and 12C show two variations on the module 1215b.

FIG. 12B illustrates one module 1215b according to a first example 1250a. FIG. 12B includes a first connection 1252, a second connection 1254, a first pair of resonators 1256, a second pair of resonators 1260, a third pair of resonators 1264, a series pair of resonators 1258a, a first resonator 1262, and a second resonator 1266, as well as an impedance 1268.

The first connection 1252 is coupled to the first pair of resonators 1256 and to the series pair of resonators 1258a. The resonators of the first pair of resonators 1256 are coupled together in parallel between the first connection 1252 and a reference node. The series pair of resonators 1258a are coupled to the second resonator 1262 and the second pair of resonators 1260. The second pair of resonators 1260 are coupled in parallel with each other between the series pair of resonators 1258a and the reference node. The first resonator 1262 is coupled to one of the resonators of the third pair of resonators 1264 and to the second resonator 1266. The second resonator 1266 is coupled to both resonators of the third pair of resonators 1264 as well as to the impedance 1268. The third pair of resonators 1264 are coupled to a reference node, and one of the resonators of the third pair of resonators 1264 is coupled to the second resonator 1266 on a first side, while the other resonator of the third pair of resonators 1264 is coupled to the second resonator 1266 on the opposite side. One of the two resonators of the third pair of resonators 1264 is coupled to the impedance 1268. In some examples, the resonator of the third pair of resonators 1264 coupled to the impedance 1268 is not coupled to the first resonator 1262.

The resonators of the series pair of resonators 1258a are coupled in series with one another between the first connection 1252 and the first resonator 1262. In some examples, the resonators of the pair of resonators 1258a are directly coupled in series with one another such that at a node located between the resonators no other resonator is coupled.

FIG. 12C is identical to FIG. 12B except that it presents a module 1215b according to a second example 1250b. The second example 1250b is identical to the first example 1250a except that the series pair of resonators 1258a has been replaced with a parallel pair of resonators 1258b. The resonators of the parallel pair of resonators 1258b are coupled in parallel with one another between the first connection 1252 and the first resonator 1262.

Either example of the module 1215b in FIGS. 12B and 12C may be used in FIG. 12A, as may other topologies not shown here.

Figure 13A:
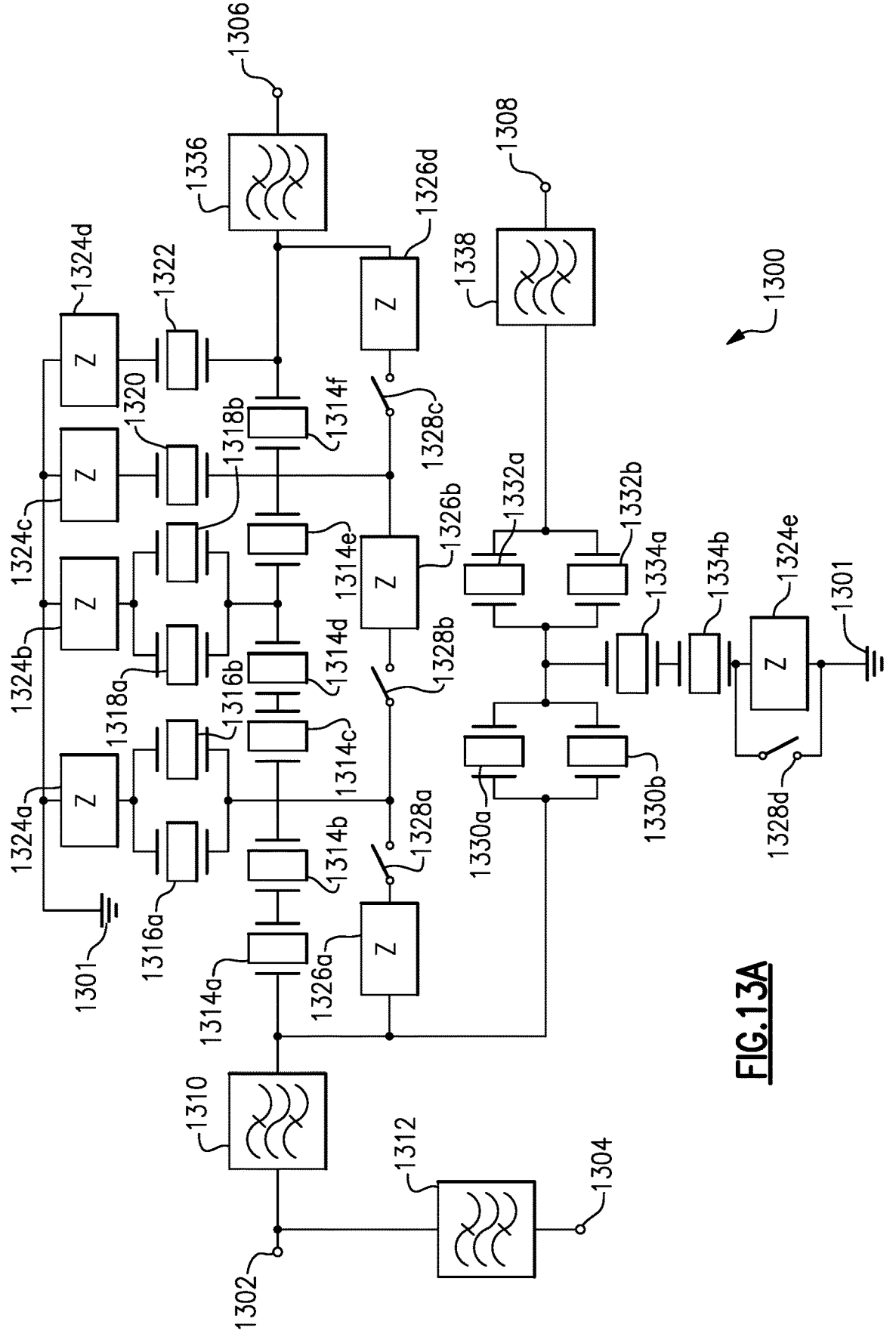
FIG. 13A illustrates a circuit according to an example.
Figure 13B:
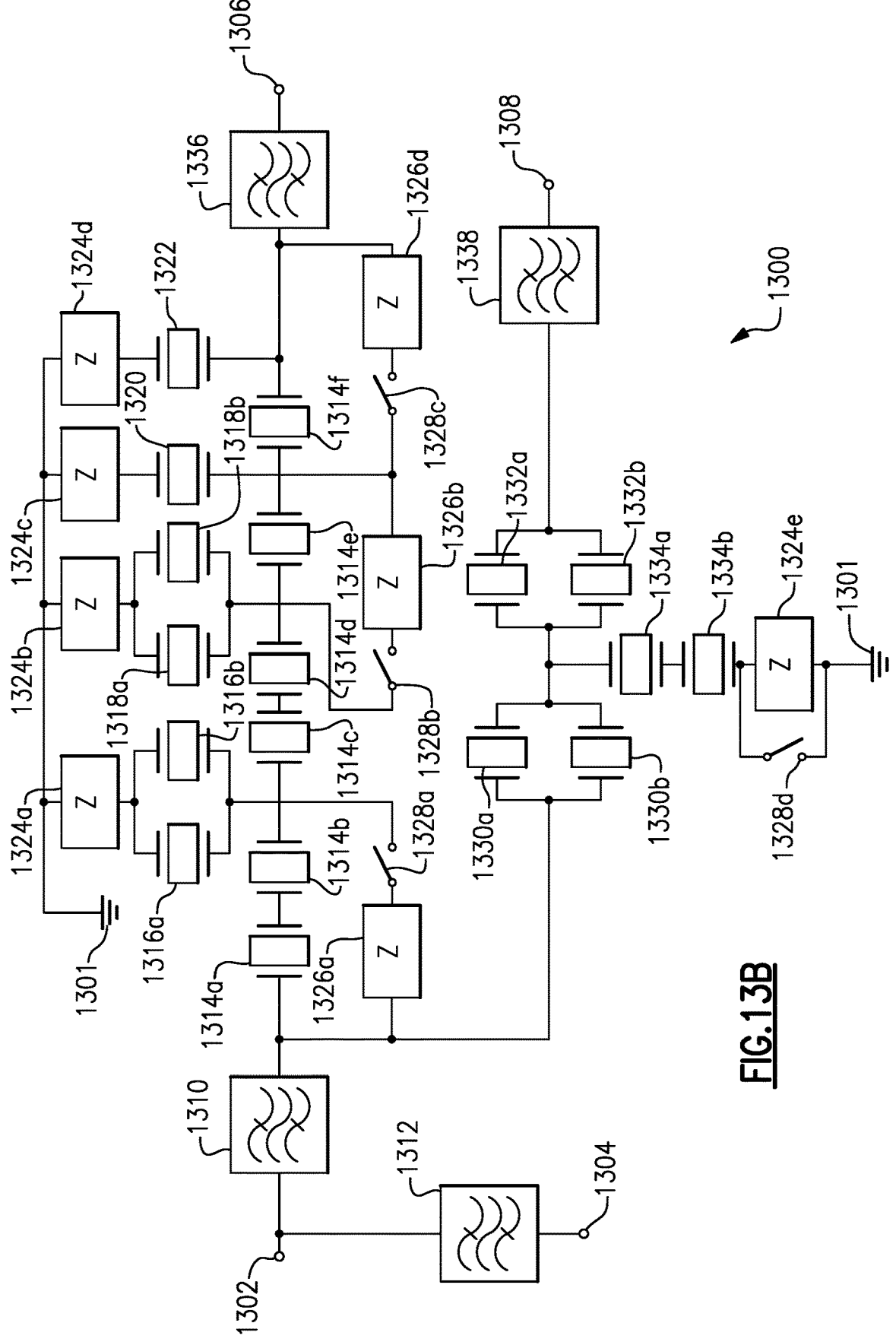
FIG. 13B illustrates a circuit according to an example.

FIGS. 13A and 13B illustrate two variations on a circuit featuring switchable resonator elements.

FIG. 13A illustrates a circuit 1300 according to an example. The circuit 1300 includes a first contact 1302, a second contact 1304, a third contact 1306, a fourth contact 1308, a first filter 1310, a second filter 1312, a first plurality of resonators 1314a, 1314b, 1314c, 1314d, 1314e, 1314f, a first parallel pair of resonators 1316a, 1316b, a second parallel pair of resonators 1318a, 1318b, a first shunt resonator 1320, a second shunt resonator 1322, a first plurality of impedances 1324a, 1324b, 1324c, 1324d, 1324e, a second plurality of impedance 1326a, 1326b, 1326d, a plurality of switches 1328a, 1328b, 1328c, 1328d, a third parallel pair of resonators 1330a, 1330b, a fourth parallel pair of resonators 1332a, 1332b, a second plurality of resonators 1334a, 1334b, a third filter 1336, a fourth filter 1338, and a reference node 1301.

The first contact 1302 is coupled to the first filter 1310 and the second filter 1312. The second filter 1312 is coupled to the second contact 1304. The first filter 1310 is coupled to the first plurality of resonators 1314 at the first resonator 1314a of the first plurality, as well as to the first impedance

1326a of the second plurality of resonators 1326, and is coupled to both resonators of the third parallel pair of resonators 1330a, 1330b. The first resonator 1334a of the first plurality is coupled to the first impedance 1326a of the second plurality of impedances and to the third parallel pair of resonators 1330a, 1330b. The second resonator 1334b of the first plurality of resonators 1334 is coupled to the first switch 1328a and the second switch 1328b of the plurality of switches 1328, as well as to the resonators of the first parallel pair of resonators 1316a, 1316b, and also to the third resonator 1314c of the first plurality of resonators 1314. The third resonator 1314c of the first plurality of resonators 1314 is coupled to the resonators of the first parallel pair of resonators 1316a, 1316b as well as to the first and second switches 1328a, 1328b, and to the fourth resonator 1314d of the first plurality of resonators 1314. The fourth resonator 1314d is coupled to the fifth resonator 1314e and to each resonator of the second parallel pair of resonators 1318a, 1318b. The fifth resonator 1314e is also coupled to each resonator of the second parallel pair of resonators 1318a, 1318b, as well as to the first shunt resonator 1320, the sixth resonator 1314f of the first plurality of resonators 1314, the second impedance 1326b of the second plurality of impedance 1326 and the third switch 1328c of the plurality of switches. The sixth resonator 1314f is coupled to the first shunt resonator 1320, the second shunt resonator 1322, the second impedance 1326b of the second plurality of impedances 1326, the third switch 1328c of the plurality of switches 1328, the third impedance 1326d of the second plurality of impedances 1326, and the third filter 1336. The third filter 1336 is coupled to third contact 1306.

The first impedance 1326a of the second plurality of impedance 1326 is further coupled to the first switch 1328a. The first switch 1328a is further coupled to the second switch 1328b and the first parallel pair of resonators 1316a, 1316b. The second switch 1328b is further coupled to the second impedance 1326b of the second plurality of impedances 1326 as well as to the first parallel pair of resonators 1316a, 1316b. The second impedance 1326b is coupled to the third switch 1328c. Both the second impedance 1326b and the third switch 1328c re coupled to the first shunt resonator 1320. The third impedance 1326d is coupled to the third filter 1336 and to the second shunt resonator 1322.

The first parallel pair of resonators 1316a, 1316b are coupled to the first impedance 1324a of the first plurality of impedances 1324. The second parallel pair of resonators 1318a, 1318b are coupled to the second impedance 1324b of the first plurality of impedances 1324. The first shunt resonator 1320 is coupled to the third impedance 1324d of the first plurality of impedances 1324, and the second shunt resonator 1322 is coupled to the fourth impedance 1324d of the first plurality of impedances 1324. Each impedance of the first plurality of impedances 1324 is further coupled to a reference node 1301.

The third parallel pair of resonators 1330a, 1330b is coupled to the first filter 1310, the first resonator 1314a of the first plurality of resonators 1314, and the first impedance 1326a of the second plurality of impedances 1326, as well as to the fourth parallel pair of resonators 1332a, 1332b and the first resonator 1334a of the second plurality of resonators 1334.

The fourth parallel pair of resonators 1332a, 1332b are coupled to the third parallel pair of resonators 1330a, 1330b, the first resonator 1334a of the second plurality of resonators 1334, and to the fourth filter 1338. The fourth filter 1338 is coupled to the fourth contact 1308. The first resonator 1334a of the second plurality of resonators 1334 is coupled to the second resonator 1334*b* of the second plurality of resonators 1334. The second resonator 1334*b* of the second plurality of resonators 1334 is coupled to the fourth switch 1328*d* and to the fifth impedance 1324*e* of the first plurality of impedances 1324. The fourth switch 1328*d* and the fifth impedance 1324*e* of the first plurality of impedances 1324 are both coupled to the reference node 1301.

The impedances of the first plurality of impedances 1324 may, in some examples, be the same type of impedance—for example, each impedance of the first plurality 1324 may be an inductor, a resistor, a capacitor or a combination of inductor, resistor, and capacitor. Each impedance of the second plurality of impedance 1326 may also be the same type of impedance. However, in some examples, if the impedances of the first plurality of impedances 1324 are of one type (e.g., inductors), the impedances of the second plurality of impedances 1326 will be of a different type (e.g., capacitors).

The circuit 1300 includes a plurality of switches 1328 including a first switch 1328*a*, a second switch 1328*b*, a third switch 1328*d*, and a fourth switch 1328*d*. When the first switch 1328*a* is in an open state, the first impedance 1326*a* of the second plurality of impedances 1328 may not be part of any conducting path in the circuit 1300. When the first switch 1328*a* is in an open state, the first impedance 1326*a* of the second plurality of impedances 1328 may be part of a conducting path in the circuit 1300 between at least the first contact 1302 and the third contact 1306 and/or the any other contact paired with the third contact 1306.

When the second switch 1328*b* is in an open state, the second impedance 1326*b* of the second plurality of impedances 1326 may not be part of any conducting path in the circuit 1300. When the second switch 1328*b* is in a closed state, the second impedance 1326*b* of the second plurality of impedances 1326 may be part of at least a conducting path between the first contact 1302 and the third contact 1306, and/or the third contact 1306 and any other contact.

When the third switch 1328*c* is in an open state, the third impedance 1326*c* of the second plurality of impedances 1326 may not be part of any conducting path in the circuit 1300. When the third switch 1328*c* is in a closed state, the third impedance 1326*c* of the second plurality of impedances 1326 may be part of at least a conducting path between the first contact 1302 and the third contact 1306, and/or the third contact 1306 and any other contact.

When the fourth switch 1328*d* is in an open state, the fifth impedance 1324*e* of the first plurality of impedances 1324 is part of a conducting path between the reference node 1301 and the rest of the circuit, possibly including any of the contacts in the circuit. When the fourth switch 1328*d* is in a closed state, the fifth impedance 1324*e* of the first plurality of impedances may not be part of a conducting path between the reference node 1301 and other nodes or locations in the circuit 1300.

FIG. 13B illustrates a circuit 1350 according to an example. The circuit 1350 of FIG. 13B is identical to the circuit 1300 of FIG. 13A, except that the second switch 1328*b* is now coupled to the fourth resonator 1314*d* and fifth resonator 1314*e* of the first plurality of resonators 1314 and to the second parallel pair of resonators 1318*a*, 1318*b*, and to the second impedance 1326*b* of the second plurality of impedances 1326 in lieu of the elements of the circuit 1300 the second switch 1328*b* was coupled to as described and shown with respect to FIG. 13A.

In circuits having branches (for example, the circuit 1000 of FIG. 10, which has a branch between the node 1002 and the first node 1004, another branch between the node 1002 and the second node 1006, and a final branch between the node 1002 and the third node 1008, each branch may have its own effective $F_R$ and $F_A$, and—in some examples—each branch's respective $F_R$ and $F_A$ may be independent of each other branch's $F_R$ and $F_A$.

In the foregoing examples and explanation, the term "bypass" will generally be understood to mean that when a switch is closed (that is, conducting), the switch will accommodate the majority of a substantial portion of the current between the nodes it is attached to. It will be understood that real components, such as switches, do not generally behave as ideal components, such that while a switch or wire may be modeled as an ideal conductor with no impedance, the actual parts generally have a small, but non-zero impedance. As explained above, the switch, when connected in parallel with other components, has the low impedance and thus dominates the impedance, effectively reducing the overall impedance of the parallel structure.

Various controllers may execute various operations discussed above. Using data stored in associated memory and/or storage, the controllers also execute one or more instructions stored on one or more non-transitory computer-readable media, which the controllers may include and/or be coupled to, that may result in manipulated data. In some examples, the controllers may include one or more processors or other types of controllers. In one example, the controllers are or include at least one processor. In another example, the controllers perform at least a portion of the operations discussed above using an application-specific integrated circuit tailored to perform particular operations in addition to, or in lieu of, a general-purpose processor. As illustrated by these examples, examples in accordance with the present disclosure may perform the operations described herein using many specific combinations of hardware and software and the disclosure is not limited to any particular combination of hardware and software components. Examples of the disclosure may include a computer-program product configured to execute methods, processes, and/or operations discussed above. The computer-program product may be, or include, one or more controllers and/or processors configured to execute instructions to perform methods, processes, and/or operations discussed above.

Having thus described several aspects of at least one embodiment, it is to be appreciated various alterations, modifications, and improvements will readily occur to those skilled in the art. Such alterations, modifications, and improvements are intended to be part of, and within the spirit and scope of, this disclosure. Accordingly, the foregoing description and drawings are by way of example only.

What is claimed is:

1. An adjustable filter comprising:
   a first contact;
   a second contact; and
   one or more switchable resonator circuits coupled between the first contact and the second contact, the one or more switchable resonator circuits being coupled in series with one another between the first contact and the second contact, each switchable resonator circuit including
      a switch,
      a first impedance, and
      a resonator coupled in parallel with a second impedance, a parallel combination of the resonator and second impedance being coupled in series with the first impedance.

2. An adjustable filter comprising:
   a first contact;

a second contact; and one or more switchable resonator circuits coupled between the first contact and the second contact, each switchable resonator circuit including a switch, a first impedance, and a resonator coupled in parallel with a second impedance, a parallel combination of the resonator and second impedance being coupled in series with the first impedance; and a resonator circuit coupled in parallel with the one or more switchable resonator circuits between the first contact and second contact, the resonator circuit including a second parallel combination of a resonator and an impedance, and a series impedance coupled in series with the second parallel combination.

3. An adjustable filter comprising:

a first contact;

a second contact; and one or more switchable resonator circuits coupled between the first contact and the second contact, each switchable resonator circuit including a switch, a first impedance, and a resonator coupled in parallel with a second impedance, a parallel combination of the resonator and second impedance being coupled in series with the first impedance; and the switch is coupled in parallel with the first impedance and the parallel combination of the resonator and second impedance.

4. The adjustable filter of claim 1 wherein the switch is coupled in series with the first impedance.

5. The adjustable filter of claim 1 further comprising a series resonator coupled in series with a first switchable resonator circuit of the one or more switchable resonator circuits.

6. The adjustable filter of claim 1 wherein the one or more switchable resonator circuits are coupled in parallel with one another between the first contact and the second contact.

7. The adjustable filter of claim 1 wherein resonator circuits of the one or more resonator circuits further include a parallel resonator coupled in parallel with the parallel combination.

8. The adjustable filter of claim 1 further comprising a parallel impedance coupled in parallel with the switch.

9. The adjustable filter of claim 1 further comprising a second switch coupled in series with the second impedance, a series combination of the second switch and second impedance being coupled in parallel with the first impedance.

10. The adjustable filter of claim 1 further comprising a plurality of resonators including a first group of series resonators and second group of parallel resonators, the first group of series resonators being coupled between an output of a switchable resonator circuit of the one or more switchable resonator circuits and the second contact.

11. The adjustable filter of claim 10 wherein each second group resonator of the second group of parallel resonators being coupled to a reference node and to a respective first group resonator of the first group of series resonators.

12. The adjustable filter of claim 10 wherein at least one resonator of the first group and the second group is a variable resonator and at least one resonator of the first group and the second group is a fixed resonator.

13. An adjustable filter comprising:

a contact;

a first contact;

a second contact;

a third contact;

a first branch coupled between the contact and the first contact;

a second branch coupled between the contact and the second contact;

a third branch coupled between the contact and the third contact; and one or more switchable resonators coupled to one or more of the first branch, the second branch, and the third branch, the first contact, second contact, and third contact each being located at a respective unique node.

14. The adjustable filter of claim 13 further wherein the first branch further comprises:

a first plurality of impedances coupled in series with respect to one another; and a second plurality of impedance coupled to the first plurality of impedance, the third contact, and a reference node.

15. The adjustable filter of claim 13 wherein the first branch comprises a plurality of resonators coupled in series between the contact and the first contact, and one or more switchable resonators coupled between one or more resonators of the plurality of resonators and a reference node.

16. The adjustable filter of claim 13 wherein the second branch comprises a first plurality of resonators coupled in series between the contact and the second contact, and a second plurality of resonators, each resonator of the second plurality of resonators being coupled between a resonator of the first plurality of resonators and a reference node, wherein at least one resonator of the first plurality of resonators is a switchable resonator.

17. The adjustable filter of claim 16 wherein each switch of the one or more switches is located on a same substrate.

18. The adjustable filter of claim 13 wherein the first branch further comprises a first pair of resonators;

a first impedance coupled to the first pair of resonators;

a parallel combination of at least one impedance and at least one resonator, the parallel combination coupled in series with the first pair of resonators with respect to the first contact and the contact;

at least one second impedance coupled to the first contact;

at least one third impedance coupled between the at least one second impedance and a reference node;

at least two resonators coupled in series with one another with respect to the contact and the reference node, and further coupled to the parallel combination and the first impedance; and a switch coupled in parallel with one or more resonators of the at least two resonators and configured to selectively bypass the one or more resonators; and the second branch further comprises a first plurality of resonators coupled in series with respect to the contact and the second contact;

at least one impedance coupled to the first plurality of resonators;

a second plurality of resonators coupled in parallel with the first plurality of resonators with respect to the contact and first contact;

a module coupled in series with the first plurality of resonators and the second contact; and a switch coupled between the first plurality of resonators and the contact.

* * * * *